US008488920B2

(12) United States Patent
Pitwon

(10) Patent No.: US 8,488,920 B2
(45) Date of Patent: Jul. 16, 2013

(54) OPTICAL PCB AND A METHOD OF MAKING AN OPTICAL PCB

(75) Inventor: Richard C. A. Pitwon, Fareham (GB)

(73) Assignee: Xyratex Technology Limited, Havant (GB)

(*) Notice: Subject to any disclaimer, the term of this patent is extended or adjusted under 35 U.S.C. 154(b) by 352 days.

(21) Appl. No.: 12/873,980

(22) Filed: Sep. 1, 2010

(65) Prior Publication Data

US 2012/0051686 A1    Mar. 1, 2012

(51) Int. Cl.
*G02B 6/12* (2006.01)
*H01S 3/00* (2006.01)

(52) U.S. Cl.
USPC ........... 385/14; 385/129; 385/141; 359/341.3

(58) Field of Classification Search
None
See application file for complete search history.

(56) References Cited

U.S. PATENT DOCUMENTS

| | | | |
|---|---|---|---|
| 5,295,010 A * | 3/1994 | Barnes et al. | 359/107 |
| 5,555,127 A * | 9/1996 | Abdelkader et al. | 359/341.1 |
| 5,581,398 A * | 12/1996 | van Veggel et al. | 359/342 |
| 5,757,989 A * | 5/1998 | Yoshimura et al. | 385/14 |
| 6,028,977 A * | 2/2000 | Newsome | 385/147 |
| 6,292,292 B1* | 9/2001 | Garito et al. | 359/341.5 |
| 6,628,853 B1* | 9/2003 | Cordina | 385/14 |
| 6,690,873 B2 | 2/2004 | Bendett et al. | 385/132 |
| 6,778,319 B2* | 8/2004 | Chavez-Pirson et al. | 359/333 |
| 6,875,561 B2* | 4/2005 | Leu et al. | 430/321 |
| 2002/0186949 A1* | 12/2002 | Gao | 385/132 |
| 2003/0223673 A1* | 12/2003 | Garito et al. | 385/14 |
| 2004/0091230 A1* | 5/2004 | Chen et al. | 385/142 |
| 2004/0151428 A1* | 8/2004 | Nikonov | 385/27 |
| 2006/0012853 A1 | 1/2006 | Tallone et al. | |
| 2008/0044130 A1* | 2/2008 | Pitwon | 385/14 |
| 2011/0286691 A1* | 11/2011 | Hopkins et al. | 385/14 |
| 2012/0051688 A1* | 3/2012 | Pitwon | 385/14 |

OTHER PUBLICATIONS

S. Lehmacher et al. Integration of polymer optical waveguides into printed circuit boards. Electronics Letters, 36:12:1052-1053, Jun. 2000.*
S. Uhlig et al. Limitations to and solutions for optical loss in optical backplanes. Journal of Lightwave Technology, 24:4:1710-1724, Apr. 2006.*
J. Yang et al. Neodymium-complex-doped photodefined polymer channel waveguide amplifiers. Optics Letters, 34:4:473-475, Feb. 2009.*
Michael J. Lochhead et al., "Rare-Earth Clustering and Aluminum Codoping in Sol-Gel Silica: Investigation Using Europium (III) Fluorescence Spectroscopy," Chem. Mater., vol. 7, No. 3, pp. 572-577 (1995).
S. Moynihan et al., "Optical properties of planar polymer waveguides doped with organo-lanthanide complexes," Optical Materials, vol. 29, pp. 1821-1830 (2007).
Shuhei Fujimoto et al., "Near Infrared Light Amplification in Dye-Doped Polymer Waveguide," Jpn. J. Appl. Phys., vol. 45, Abstract (2006).
A.J. Heeger, "Conjugated Polymers and Related Materials," http://en.wikipedia.org/wiki/Organic_LED—cite_ref-33, in W. R. Salaneck, I. Lundstrom, B. Ranby, pp. 27-62. ISBN 0198557299, Oxford 1993.
R. Kiebooms et al., "Synthesis, Electrical, and Optical Properties of Conjugated Polymers," Handbook of Advanced Electronic and Photonic Materials and Devices, vol. 8, pp. 1-86 (2001).
Richard Pitwon, "Design and implementation of an electro-optical backplane with pluggable in-plane connectors," SPIE Photonics West—OPTO Paper: Opto 7607-18, pp. 1-30, San Francisco, Jan. 26, 2010.
Kenneth M. Hopkins et al., U.S. Appl. No. 12/785,931, filed May 24, 2010.

* cited by examiner

*Primary Examiner* — Mike Stahl
(74) *Attorney, Agent, or Firm* — Pillsbury Winthrop Shaw Pittman LLP

(57) ABSTRACT

The invention provides an optical printed circuit board, comprising: plural polymer waveguide sections from independent waveguides, each of the sections being doped with an amplifying dopant; an optical pump source to pump the plural polymer waveguide sections, wherein the plural waveguide sections are arranged close or adjacent to one another such that a the optical pump source is able to pump plural of the optical waveguide sections.

20 Claims, 31 Drawing Sheets

OPTICAL PCB AND A METHOD OF MAKING AN OPTICAL PCB

The present invention relates to an optical PCB, and a method of making an optical PCB.

As the sizes of optical printed circuit boards increase a number of issues arise related to signal absorption. First, there is a need to compensate for the absorption of the optical signals conveyed along the embedded waveguides by the material of which those waveguides are comprised. Second, optical losses are encountered at the ingress and egress waveguide coupling interfaces due to surface roughness scattering and Fresnel effects. Third, optical losses are also caused due to scattering by the side walls of the waveguides. In particular, waveguides composed of polymer are generally more absorbent of light at certain optical frequencies commonly used in data communication, compared to glass fibres.

This signal absorption can be mitigated by providing correspondingly higher powered optical signals along waveguides on the PCBs. One way to achieve this is to increase the power of the signals as they are generated; in other words, provide more powerful light sources. However, this will give rise to an increase in power consumption of the light source and power density and there are limits to how powerful an input signal can be made without introducing distortion or degrading the signal in other ways.

As optical "super backplanes" (optical PCBs used as backplanes in large scale data storage systems, which may be provided as modular backplanes) become more widely used, the need to enable an optical signal in a PCB to travel larger distances and therefore require high power at generation, will increase correspondingly.

In our co-pending U.S. patent application Ser. No. 12/785,931 filed 24 May 2010, the entire contents of which are hereby incorporated by reference, there is disclosed a modular optical PCB. FIG. 1A shows a schematic representation of an optical PCB as disclosed in U.S. Ser. No. 12/785,931, the optical PCB comprising three separate component PCBs $1_1$, $1_2$ and $1_3$. In this example, the component PCBs $1_1$ to $1_3$ are arranged for connection by movement in a single direction, i.e. in the direction of the axis XX'. The component circuit boards $1_1$ to $1_3$ comprise electrical connectors 3 which are typically provided for low speed control signals and possibly also data signals. In addition, high-speed optical connectors 5 are provided on the component circuit boards in such a way as to enable optical signals to be transmitted between the respective pairs of adjacent component circuit boards $1_1$ to $1_3$.

In some embodiments disclosed in U.S. Ser. No. 12/785,931, the modular PCB is in the form of modular backplane provided for arrangement within the housing of a storage system. By providing a modular PCB backplane, the difficulties associated with manufacturing a single large PCB are avoided. In addition, the use of optical waveguides within the modular PCB backplane ensures that the problems associated with electrical connection and signal propagation across a large electrical PCB are avoided. However, the larger the overall size of the PCB, i.e. the greater the number of modular component PCBs assembled into the main PCB, the longer the distances that optical signals have to travel from source to destination.

An alternative or additional means to using higher powered input signals is to use some form of amplification of a signal as it passes along the optical channel in the PCB. Optical fibre amplifiers are well known. They have been used for some time on fibres such as silica fibres (which are made up of a silica matrix), to allow transmission of optical signals over long distance (1000s of kilometers) without intermediary opto-electronic and electro-optic conversion. This has been achieved by doping certain segments of the fibres, known as active regions, with lanthanides. Examples of dopant materials used include neodymium and praseodymium, which have emission bands around 1300 nm and erbium which has an emission band around 1550 nm.

The presence of lanthanides allows the active region to be optically pumped to generate a population inversion in its electron states, i.e. a higher proportion of dopant atoms or molecules are in an excited state than in their normal lower energy state. This satisfies the condition for stimulated emission whereby an incoming signal photon interacts with the excited atom and the latter's excited electron falls to a lower energy state while emitting a photon with the same energy (wavelength) and phase and in the same direction as the original photon. This gives rise to an amplification of incoming optical signals through the active region. This is also the dominant mechanism on which laser (light amplified stimulated emission of radiation) operation is based, except that lasers have optical cavities where light is contained within the active region by mirrors, one of which is only partially reflecting, thus enabling the light to escape along a controlled trajectory.

A disadvantage of silica is that the achievable concentration of dopants in the silica matrix is quite low, typically about 0.1 mol %. Higher doping concentrations give rise to the phenomenon known as rare earth ion clustering as described by Lochhead in "Rare-Earth Clustering and Aluminum Codoping in Sol-Gel Silica: Investigation Using Europium (III) Fluorescence Spectroscopy", Chem. Mater., 1995, 7 (3), pp 572-577, the entire contents of which are hereby incorporated by reference. This has a detrimental effect on the photoluminescence, i.e. the ability of a substance to absorb and subsequently reemit a photon. Therefore, active regions in silica fibres need to be very long in order to provide effective amplification. Certain amorphous polymers on the other hand lend themselves to much higher doping concentrations and therefore the active regions can be significantly shorter to enable practical deployment on an optical PCB. Suitable polymers include polyacrylates (e.g. poly(methyl methacrylate), polystyrene, polycarbonate and polysiloxane.

Research has been carried out on a variety of polymer doping schemes to enable optical amplification by polymer waveguides. One such example is described in the article entitled "Optical Properties of Planar Polymer Waveguides Doped with Organo-Lanthanide Complexes" Science Direct Optical Materials 29 (2007) pp. 1821-1830 by Moynihan, S. et al. There is disclosed the fabrication of thin film optical polymer sheets doped with organo-lanthanide dopants. This demonstrates optical fluorescence in the visible and near-infrared required for amplification. Another such example is described in the article entitled "Near Infrared Light Amplification in Dye-Doped Polymer Waveguide" Japanese Journal Applied Physics 45 (2006) pp. L355-L357, by Fujimoto, S. et al. The entire contents of both of these articles is hereby incorporated by reference.

The lanthanide ions $Tb^{3+}$ (Terbium), $Dy^{3+}$ (Dysprosium), $Eu^{3+}$ (Europium) and $Sm^{3+}$ (Samarium) fluoresce in the wavelength band of 550 nm-650 nm, which is close to the polymer transmission window of 850 nm. Appropriate complexes of these lanthanides could be devised which push the fluorescence band into the polymer transmission window. Moynihan et al describes how doped polymer may be created by stiffing the dopant material into the liquid polymer for a day to achieve the required concentration.

US-A-2006/0012853 discloses an optical amplifier including a substrate having disposed thereon an optical waveguide, the optical waveguide having an active region with Si nanocrystals dispersed in an erbium doped glass matrix. A light is arranged to irradiate the doped waveguide with pump electromagnetic radiation. The amplifier also includes means for suitably shaping an input electromagnetic field to be amplified into the active region of the optical waveguide.

According to a first aspect of the present invention, there is provided an optical printed circuit board, comprising plural optical waveguides for transmission and propagation of optical signals, each of the plural optical waveguides including a section doped with an amplifying dopant; an optical pump source to pump the plural polymer waveguide sections, wherein the plural doped waveguide sections are arranged close or adjacent to one another such that the optical pump source is able to pump plural of the optical waveguide sections.

Thus, there is provided a low cost design structure for polymer optical waveguides that enables the on-board amplification of optical signals on an optical PCB. So as to minimise the number of pump sources, the waveguide layout is configured to include what may be referred to as "amplification nodes" in which plural doped waveguide sections are arranged close or adjacent to one another. Thus the waveguides are formed, patterned or arranged to create waveguide confluences or nodes on specified areas of the PCB, where the active regions of as many waveguides as possible can be pumped by the same source device.

Preferably, the optical PCB comprises crosstalk suppression elements to reduce crosstalk between the plural doped polymer waveguide sections. This enables the waveguides to be formed close to each other whilst reducing or avoiding the risk of crosstalk between individual ones of the waveguides. This means that the footprint of the node can be smaller than would have been possible using conventional design guidelines. In addition the size of the required pump source can be appropriately reduced.

In one embodiment, a crosstalk suppression element is provided between each pair of polymer waveguide sections.

In one embodiment, the or each crosstalk suppression element comprises a trench formed between the respective pair of polymer waveguide sections.

In one embodiment, the trench is an air-filled trench. Such a crosstalk suppression element is relatively low cost and easy to form. In practice the trench could be formed using various lithographic techniques including the use of an appropriate mask and selective curing of the cladding layer surrounding the waveguide cores. Alternatively some form of ablation, e.g. laser ablation or chemical etching could be used to form the required trench. Since air is used as the material within the trench, once the trench is formed the crosstalk suppression element is effectively formed.

In one embodiment, the trench is filled with an optical blocking material. Non-limiting examples of appropriate optical blocking materials include a transparent matrix having suspended therein an optically absorbent material and a solid piece or section of light absorbing material such as charcoal or carbon. Use of a material within the trench provides the trench with greater crosstalk suppression qualities.

In one embodiment, the plural polymer waveguide sections are arranged so that they do not cross within the node. In a preferred embodiment the waveguides are parallel.

In one embodiment, the plural polymer waveguide sections are arranged to cross each other within the node. In one embodiment, at least one pair of polymer waveguide sections are arranged co-directionally and at least one pair of polymer waveguide sections are arranged to cross each other within the node.

This is particularly advantageous as it means that the single node can effectively act as an amplifier for two independent sets of waveguides arranged in, say, orthogonal directions. This further scales up the number of waveguides that can be accommodated within the space of the node. The ability to enter the amplification node from different (say orthogonal) directions also significantly simplifies the task of routing waveguides on the board to the amplification node by removing a directional constraint. If waveguides could only enter the node from one direction then certain waveguides, depending on their provenance, would require additional bends to align themselves with the entrance to the amplification node. The ability to cross waveguides over means that this constraint is effectively removed.

When waveguides cross each other orthogonally there is actually very little leakage of signal light from one waveguide to another. However, crossed waveguides are not constrained to cross each other in purely orthogonal directions. Waveguides can cross each other over a wide range of angles, while not incurring unacceptable signal leakage from one to the other. This range of possible crossing angles depends on a variety of factors including fabrication techniques, surface roughness properties, material properties and relative dimensions of the waveguides. Previous research conducted by Xyratex Technology Limited and collaborators has demonstrated waveguides crossing each other at between 90° and 30° while not incurring significant crosstalk, as disclosed by R. Pitwon in "Design and implementation of an electro-optical backplane with pluggable in-plane connectors," Proc. SPIE 7607,doi:10.1117/12.841985 (2010), the entire contents of which are hereby incorporated by reference. Thus, there can be potentially numerous entrance points to the amplification node at a range of angles.

Using lithographic techniques or otherwise the arrangement of waveguides can be formed easily and conveniently.

According to a second aspect of the present invention, there is provided an optical printed circuit board, comprising: plural waveguides for the transfer of optical signals across the PCB, wherein each of the waveguides has an active region doped with an amplifying material for amplification of signals propagating therethrough; plural of the waveguides being routed through a common amplification zone defining an amplification node; an optical pump source to pump the plural polymer waveguide sections within the common amplification zone.

Preferably, the PCB comprises plural light amplification nodes arranged so as to minimise deviation of any given waveguide from its shortest path across the PCB.

According to a third aspect of the present invention, there is provided a light amplification node for an optical printed circuit board, the node comprising: plural polymer waveguide sections from independent waveguides, each of the sections being doped with an amplifying dopant; an optical pump source to pump the plural polymer waveguide sections, wherein the plural waveguide sections are arranged close or adjacent to one another such that the optical pump source is able to pump plural of the optical waveguide sections.

According to a fourth aspect of the present invention, there is provided an optical printed circuit board, comprising: plural waveguides for the transfer of optical signals across the PCB; and, at least one light amplification node according to the third aspect of the present invention.

According to a fifth aspect of the present invention, there is provided a method of making an optical amplification node, the method comprising: providing a PCB substrate; on the substrate forming plural waveguides; routing at least two of the waveguides so that they pass in close proximity to each other; forming between the at least two waveguides one or more crosstalk suppression elements; doping the at least two waveguides in the region that they pass in close proximity to each other so as to enable the waveguides to amplify optical signals passing therethrough in the presence of pump radiation.

A simple and reliable method is provided for making an optical amplification node or optical PCB including such a node. By forming waveguides, doping them as required and routing them on an optical PCB to be in close proximity to each other, an amplification node can be formed which enables signals propagating on an optical PCB that includes the node to be amplified in a straightforward and reliable manner.

Preferably, in one example the waveguide sections are routed so that at their closest, their pitch (core-to-core distance) is less than 250 µm. Preferably, the waveguide sections are routed so that at their closest, their pitch is less than 125 µm. It will be appreciated that the minimum separation is selected in dependence on various factors including, but not limited to, fabrication techniques, waveguide surface properties, material properties and minimum acceptable crosstalk. Ultimately, independent waveguides can be placed arbitrarily close to each other as long as the signal leakage between them remains below the threshold set by the requirements of the application in question.

Preferably, the step of forming the waveguides is selected from the group consisting of Double Core Lithography, Cladding Lithography, Laser Ablation of Doped and Undoped Cores, Laser Ablation of Undoped Cores and Cladding and Polymer Printing. Non-limiting examples of these processes are provided in detail below.

In one embodiment, the method comprises: forming an undoped polymer core layer on a substrate and patterning the undoped polymer core layer to form undoped sections of the waveguides; and forming a doped polymer core layer on the substrate and patterning the doped polymer core layer to form the doped sections and to connect with the undoped sections.

This may be referred to as a "double core" lithographic technique as there is involved the lithographic formation of waveguides in steps using two core polymer layers. In other words, in a preferred example, two core polymer layers are processed in sequence, each being laid down and cured. One of the core polymer layers is doped and one undoped to form corresponding sections of waveguides.

In one embodiment, the method comprises: forming undoped sections of the waveguides, forming an undoped lower cladding layer on a substrate, surrounding entirely the formed undoped sections of the waveguides; patterning the undoped lower cladding layer to leave trenches corresponding to regions for the formation of the formed plural doped polymer waveguide sections; forming plural doped polymer waveguide sections within the trenches.

This may be referred to as the use of "cladding lithography", since it is the cladding that is formed using lithographic techniques to be shaped so as to be able to receive appropriate doped polymer material. Using lithographic techniques, the cladding is patterned so as to have a trench for the receipt of doped polymer material.

In one embodiment, the step of forming the waveguides comprises: forming an undoped polymer layer on a substrate; ablating the undoped polymer material from all regions apart from those required for the formation of undoped sections of the waveguides; forming a layer of doped polymer material on the resultant structure; ablating the doped polymer material from all regions apart from those required for the formation of undoped sections of the waveguides.

This is referred to as "laser ablation of doped and undoped cores" since a laser is used to ablate material from a doped and undoped core layer respectively so as to form waveguides having a desired configuration and composition. A layer of undoped core polymer material is first laid down, is patterned and then unrequired parts thereof are removed. Then, a doped polymer core layer is laid down and the parts not required to form waveguide sections are removed. Clearly, these steps could be performed in either order.

In one embodiment, the step of forming the waveguides comprises: forming an undoped polymer layer on a substrate; ablating the undoped polymer material from all regions apart from those required for the formation of undoped sections of the waveguides; applying a cladding layer over the resultant structure; ablating the cladding layer from regions required for the formation of the doped sections of the waveguides; forming plural doped polymer waveguide sections within the ablated regions of the cladding layer.

In one embodiment, the step of forming the waveguides comprises inkjet printing one or more polymer materials of a required composition to form waveguides on a substrate, the method comprising; printing a first region of undoped core polymer material to form undoped sections of the waveguides; printing a second region of doped core polymer material to form doped sections of the waveguides.

In a preferred embodiment plural chambers containing polymer of differing composition are provided and the polymer from a required chamber is drawn at any time to form a section of waveguide. In other words, there might be provided two chambers, one with doped core polymer and one with undoped core polymer. To form a waveguide with the desired formation initially undoped polymer would be laid down. Then when the doped region is to be formed the chamber with doped core polymer is selected as the source. When the doped region is completed the undoped chamber would be selected again. This is analogous to inkjet printing in plural colours and changing from one colour to another and then back again.

Preferably when using inkjet printing for formation of waveguides an assembly including an integrated curing radiation source is provided. A method may be provided comprising, applying curing radiation to the waveguide sections substantially simultaneously with the printing. In other words, as the uncured polymer is ejected from the printing assembly it is substantially simultaneously, i.e. as soon as it makes contact with the underlying surface onto which it is being printed, exposed to curing radiation. This enables the desired waveguide shapes and configurations to be easily and conveniently formed.

In one embodiment, the waveguides are formed on a first major surface of the PCB substrate, and the method comprises forming on a second opposite major surface of the PCB substrate one or more electrical layers and conductors. Thus, protection from pump light is automatically provided to the electrical layers of the PCB formed on the second opposite major surface of the PCB substrate, by the PCB substrate itself. Exposure of conducting channels or layers to higher frequency optical radiation can give rise to the Photoelectric Effect, whereby electrons absorb high energy photons and are ejected from the conducting surface. This can be detrimental to the performance of the electrical sections of the PCB by creating unintended leakage currents in certain parts of the board.

According to a further aspect of the present invention, there is provided an optical printed circuit board, comprising: plural polymer waveguide sections from independent waveguides, each of the sections being doped with an optical amplifying dopant, the plural polymer waveguide sections being arranged close or adjacent to one another. It is preferred that the maximum pitch-to-pitch separation of the waveguides is less than or equal to 125 μm.

Embodiments of the present invention will now be described in detail with reference to the accompanying drawings, in which:

FIG. 1A shows a schematic representation optical PCB as disclosed in U.S. Ser. No. 12/785,931;

Figure 1A:
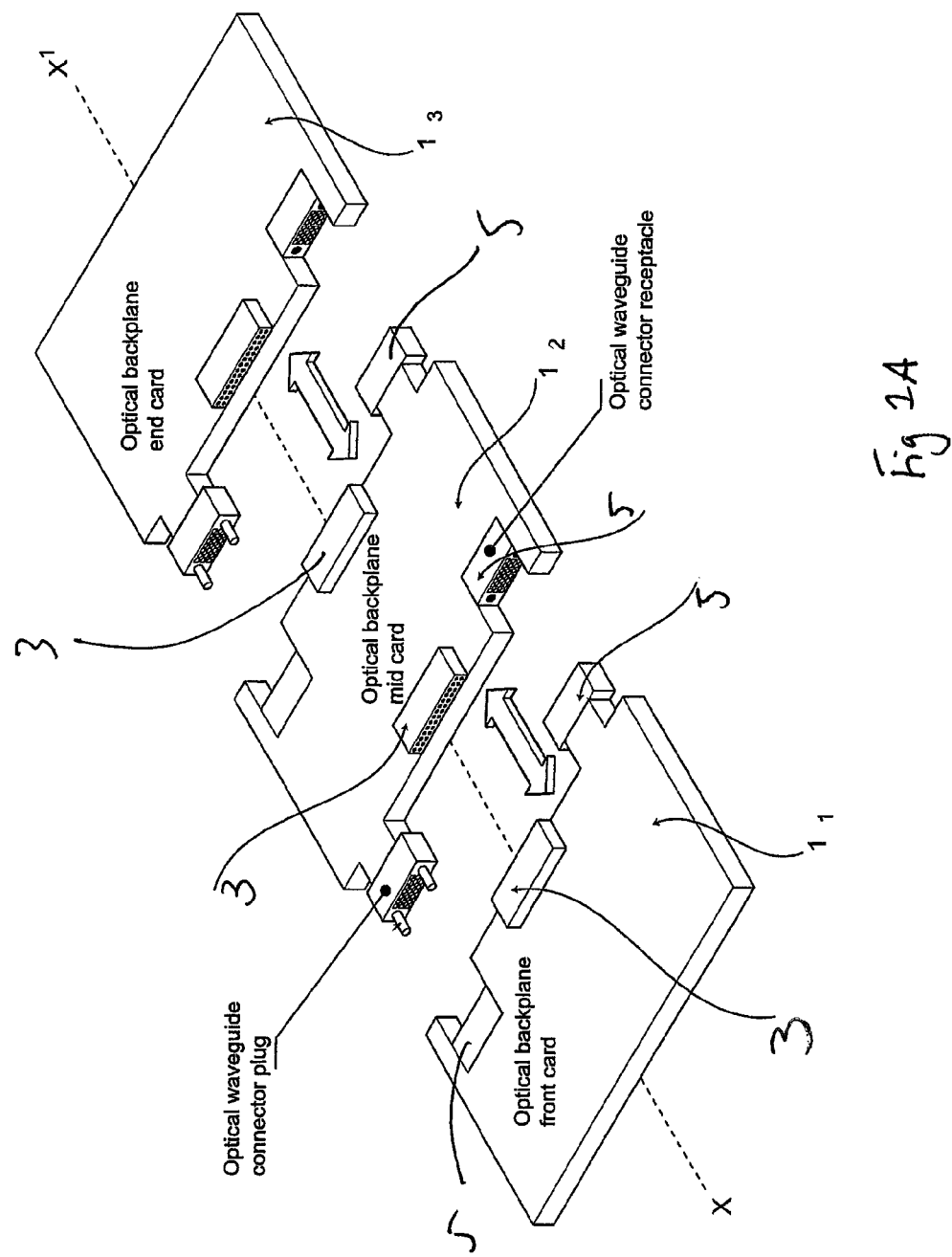
FIG. 1B is a schematic representation of an optical PCB having plural light amplification nodes.
Figure 1B:
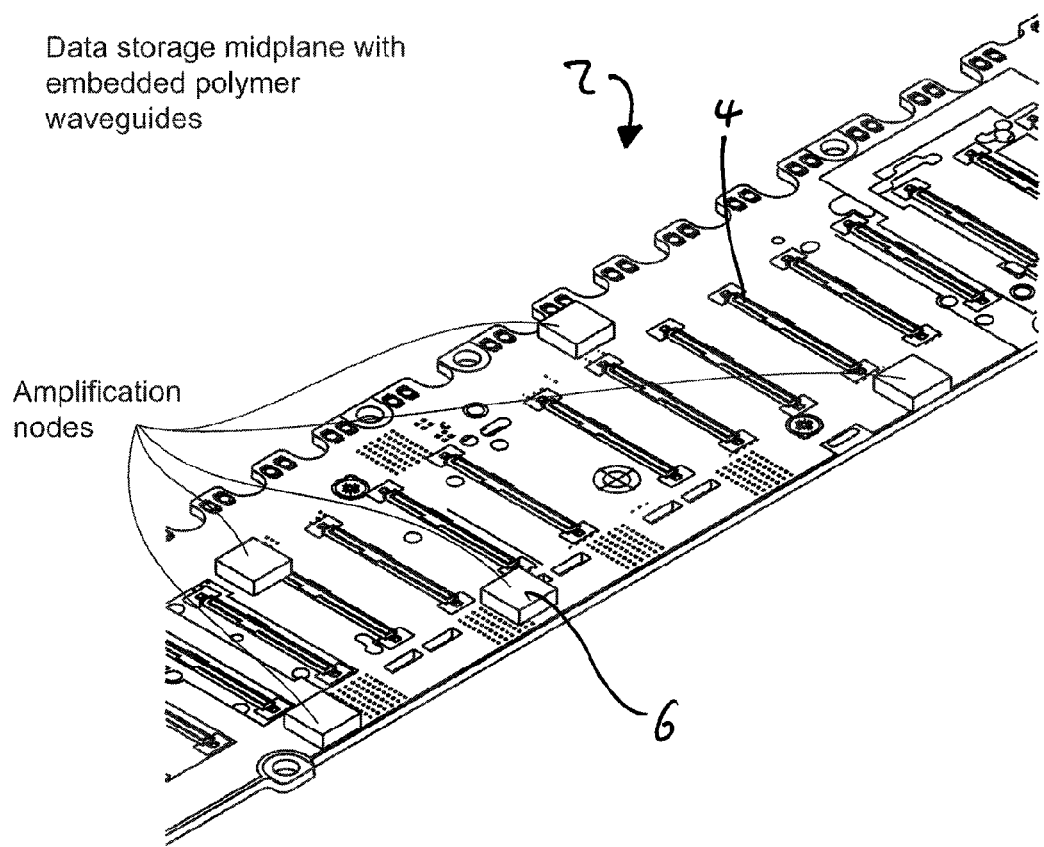

FIG. 1B shows a schematic representation of an optical printed circuit board (PCB) 2 having plural light amplification nodes 6. In this example, the optical PCB 2 is a data storage midplane and it is provided with having embedded polymer waveguides. The PCB 2 could be any type of PCB that includes optical and electrical channels. Generally, and as used herein, the term "optical PCB" means a printed circuit board that includes optical channels which might, in one non-limiting example be in the form of embedded polymer waveguides. An optical PCB will usually also include one or more metal, e.g. Cu, layers for distribution of electrical power and/or transmission and propagation of electrical signals.

In the example of FIG. 1B, the midplane 2 has a number of sockets 4 for receiving data storage devices such as hard disk drives. On the reverse side of the midplane (not shown) there might be provided sockets for connection to input/output units of a data storage system. The midplane 2 includes plural amplification nodes 6. The amplification nodes are specified areas on the optical PCB to which waveguides are routed and within which the sections of those waveguides passing through it are doped so as to enable a single pump source to be used for more than one doped waveguide.

The provision of a single or "shared" pump source for an amplification node has various advantages both in terms of a reduction in part count and also in terms of operation of the device. As regards part count, by providing more than one doped waveguide in a specific region of an optical PCB, a single pump source can be used to provide pump light to more than one waveguide, thus obviating the need for a one-to-one relationship between doped waveguides and pump sources. Furthermore, since the optical pump radiation need only be provided at a specified region of the midplane 2 other areas of the midplane are entirely unaffected directly by the optical pump source radiation. As will be explained below with reference to FIGS. 28 and 29 this has advantages in terms of the reduced need for shielding of electrical components on the midplane.

It will be appreciated that conventionally the routing of waveguides on an optical PCB would be determined or designed so as to maintain an appropriate physical separation between adjacent waveguides such as to minimise crosstalk or other such effects. In the present case, in contrast to this, plural waveguides, each with an active region, are routed to be close to each other within a so-called "amplification node" so as to enable pumping of plural waveguides by a common or shared pump source and to preferably maximise the number of said waveguides that can be pumped by a shared source.

Figure 2:
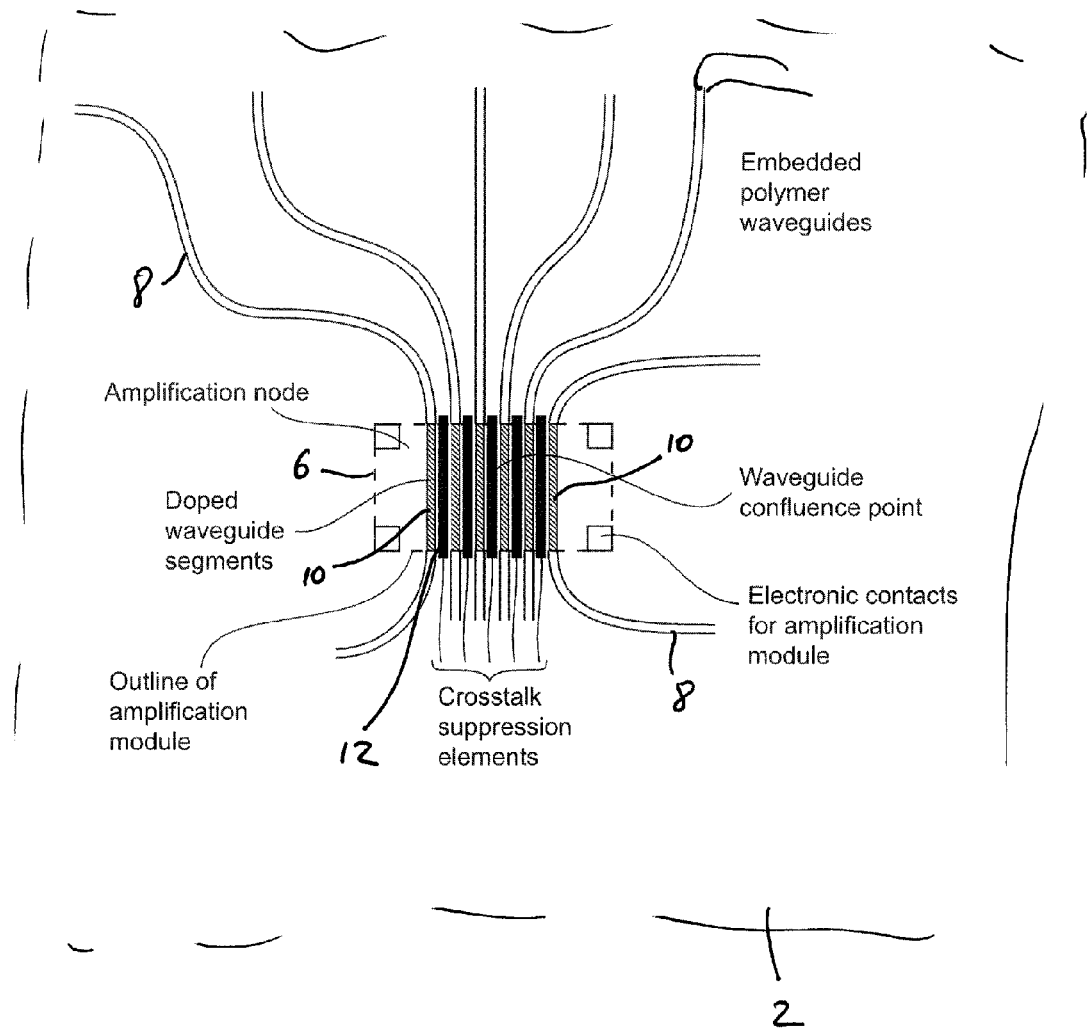
FIG. 2 is a schematic representation of a light amplification node.

FIG. 2 shows a more detailed example of an amplification node 6 as might be provided on an optical PCB. The amplification node 6 may be thought of as a waveguide confluence point. In other words, it is a specific region on the optical PCB where plural waveguides are routed to be as close to each other as possible or necessary, while not incurring unacceptable crosstalk. This enables the hardware required for pumping of the waveguides to be reduced.

Referring again to FIG. 2, plural waveguides 8 can be seen coming into and out of the amplification node 6. The waveguides 8 which are outside the perimeter of the amplification node 6 are not doped or changed in any way. They are, in this particular example, simply embedded polymer waveguides provided on the optical PCB 2. Within the specified region of the amplification node 6 a part of each of the waveguides 10 is doped with an appropriate dopant so as to provide required amplification of signals passing through the waveguide. An optical pump source (not shown in FIG. 2) is provided to generate pump radiation for irradiation on to the doped regions 10 of the waveguides 8. This means that as light propagates along one of the waveguides 8 and through the region 10 of the respective waveguide within the node 6, it is amplified due to the known phenomenon described above.

Typically backplane PCBs in data storage applications would require hundreds of high speed channels. Indeed, in high performance computing (HPC) there could be thousands of such high speed channels. If polymer optical waveguides, such as embedded polymer optical waveguides, were used to convey high speed signals in the systems then the cost of separate amplification on each waveguide as well as the combined power consumption of the pump devices would be prohibitive. In addition, the technical feasibility of such a device would be stretched due to the requirements to provide so many individual pump sources. In the present system, multiple waveguides (as many as is convenient to the designer) are brought together into close proximity within the amplification nodes on the optical PCB. The segment of each waveguide in an amplification node is composed of an active material such as a polymer matrix doped with an appropriate amplification material. Appropriate amplification materials might be lanthanide ions such as Terbium ($Tb^{3+}$), Dysprosium ($Dy^{3+}$), Europium ($Eu^{3+}$), Samarium ($Sm^{3+}$) and complexes thereof or fluorescent dyes (organic or inorganic). In the journal paper "Near Infrared Light Amplification in Dye-Doped Polymer Waveguide", Jpn. J. Appl. Phys. 45 (2006) pp. L355-L357, Fujimoto discloses a near infrared emitting dye, 2-[7-(1,3-dihydro-1,3,3-trimethyl-2H-indol-2-ylidene)-1,3,5-heptatrienyl]-1,3,3-trimethyl-3H-indolium iodide dispersed in poly(vinylpyrrolidone) used to make dye doped polymer waveguides which exhibit high optical gain due to amplified spontaneous emission.

In addition to the doped waveguide regions, crosstalk suppression elements 12 are provided within the amplification node 6 on the optical PCB. Signal light propagating through the active waveguide region or amplification node 6 will be amplified. As such, the amount of optical power in different modes will also be amplified. Therefore, some optical loss can be expected through modal expulsion or scattering. This could be due to a lack of stability of the new optical power distribution between modes imposed by the sudden optical amplification. Accordingly, power coupling between modes may occur which could also give rise to coupling of some optical power from the bound modes of the waveguide to the radiation modes, i.e. some optical power may be expelled from the waveguide.

In addition, the pumped waveguide regions 10 would be expected to fluoresce slightly through spontaneous emission, which is distinct from stimulated emission by which the amplification is achieved. Accordingly, crosstalk between waveguides may be increased within the amplification nodes 6 on the optical PCB. To address this, elements or components 12 are provided to suppress crosstalk between the doped waveguide regions 10.

Any suitable means for suppressing crosstalk may be provided. In one example, air-trenches are etched or patterned in the cladding between waveguide cores. In another example, optical blocking material is deposited in trenches between the waveguide regions 10. In a preferred example, crosstalk suppression features such as those described in the co-owned patent application US-A-2008/0044130 may be provided. In this patent application, a crosstalk suppression element is provided which is made up of a trench containing a transparent matrix having suspended therein an optically absorbent material. The transparent matrix is the same material as used for the cladding of the waveguides. This has the effect that optical signal light passing through the waveguides "sees" no boundary between the cladding and the optical crosstalk suppression region and accordingly there is no reflection of stray signal light back into the waveguide core at the cladding/trench boundary. The light is then absorbed by the suspended optical absorbent material within the trench.

In some examples, to accommodate a high number of waveguides within the limited area of an amplification node on an optical PCB, the waveguide pitch, i.e. the gap between adjacent waveguides, is reduced below the minimum dictated by prevailing design rules. Currently a standard minimum centre-to-centre pitch for adjacent waveguides is recommended as being approximately 250 µm. If the minimum pitch is reduced below this minimum recommended by prevailing design rules, it is possible that crosstalk issues would become more prevalent. Thus, the use of crosstalk suppression features within amplification nodes is extremely beneficial. This enables a higher number of waveguides to be arranged within a single amplification node on an optical PCB without suffering negative effects due to the necessarily reduced pitch.

It will be appreciated that a small proportion of any optical signal propagating along a waveguide travels along the outside of the waveguide core. This is referred to as the so-called evanescent wave. The presence of the evanescent wave can have an effect on the optical signal and amplification in three different cases.

First in the situation in which the polymer core is doped and the cladding is un-doped, the signal propagating along the core would be amplified, but the signal propagating in the cladding would not be amplified. This would cause more optical energy to be shifted from the core to the evanescent tail. However this should not be detrimental to the amplified signal.

Second, in another example, both the polymer core and the cladding are doped with an optical amplifier. In this case, both the signal propagating in the core and the cladding would be amplified. This should not result in energy transfer between the core and the cladding. It would simply amplify more of the signal and therefore produce a higher gain. This doping arrangement is therefore preferable from a performance point of view. However this must be balanced against the additional cost and time that manufacture would entail. In many cases, doping of the core alone would be sufficient.

It is also possible, as a third option that the polymer core is un-doped and the cladding is doped. This is unlikely to be of significant use since limited amplification of the original signal would be generated.

As explained above, in order to minimise cost, as many waveguides as possible would typically be arranged to pass through a single amplification node on an optical PCB. However, it is preferred that modifications to normal waveguide layout on the PCB, i.e. the way that waveguides would be arranged if they were not to be passed through an amplification node, be moderate and not lead to dramatic deviations in the course of a given waveguide.

Accordingly, in a preferred embodiment, plural amplification nodes are provided distributed at convenient locations across the optical PCB so as to avoid or minimise significant deviations in the course of a given waveguide. Deviation may be quantified in terms of additional length of waveguide, number of additional bends (with each bend described in terms of bend radius, bend angle and bend length), number of additional crossovers (with each crossover defined by crossing angle) compared to the original waveguide course. Minimisation or reduction of deviation requires a minimisation or reduction of any of the above factors.

Double Core Lithography

Figure 3:
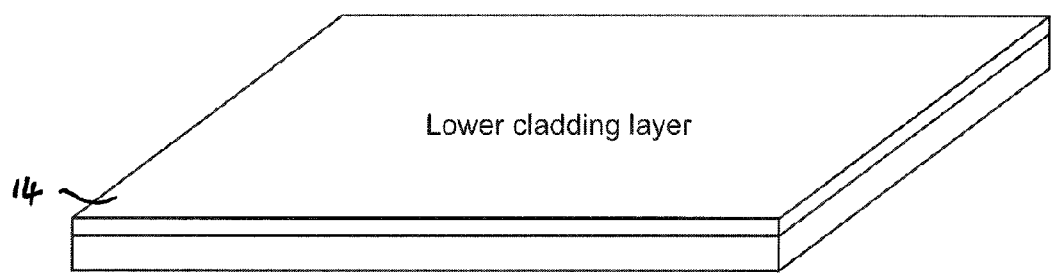
FIGS. 3 to 8 are schematic views showing the steps in one method of making a light amplification node.

Referring to FIG. 3, a method herein named as "double core lithography" is disclosed for the manufacture of the active segments of polymer waveguides within an amplification node on an optical PCB.

The known technique of photo-lithographic patterning using ultraviolet curable polymer is modified to create a doped polymer core segment within an un-doped polymer waveguide. Referring to FIG. 3, a lower cladding layer is provided on a substrate material. The lower cladding 14 is cured uniformly such as to provide a substrate on which the amplification node can be formed.

Figure 4:
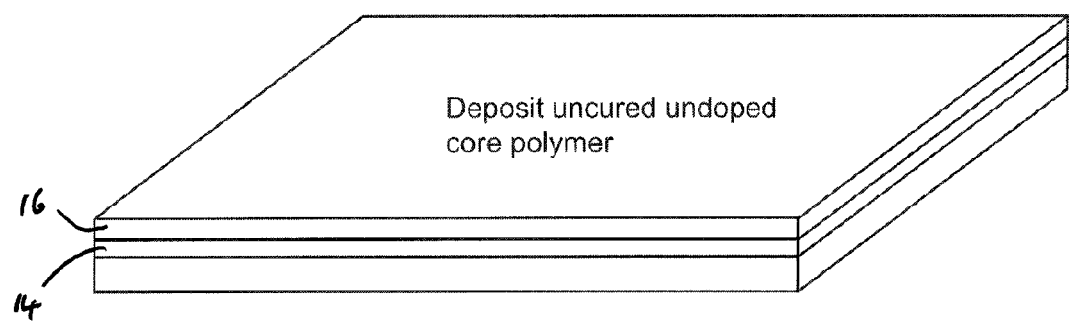
Figure 5:
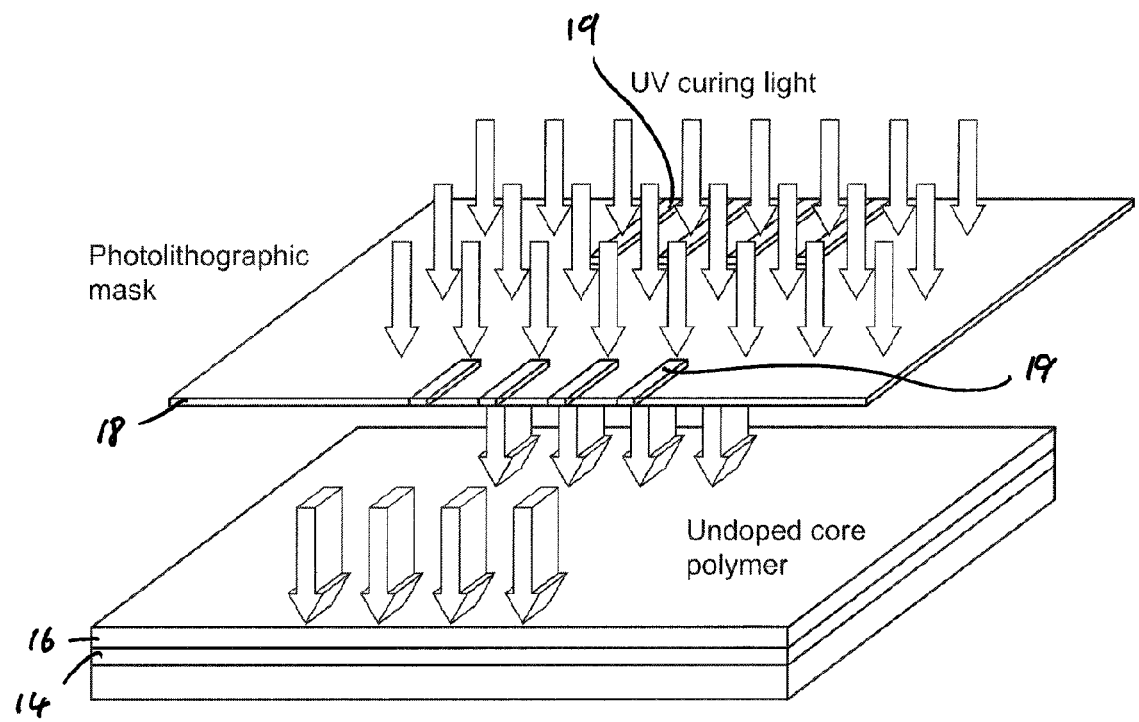
Figure 6:
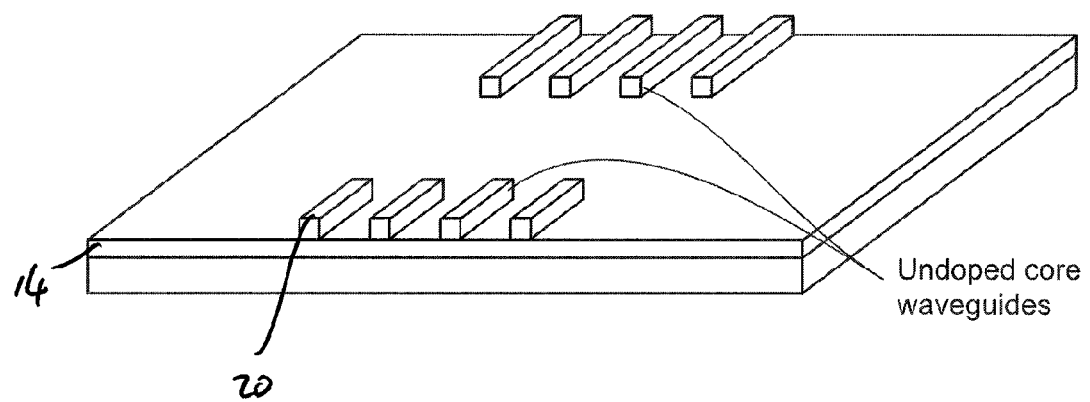

Next, as shown in FIG. 4, a layer 16 of uncured, un-doped core polymer is deposited. Next, as shown in FIG. 5 a mask 18 is arranged in proximity to the layer 16 of un-doped core polymer. The mask 18 is formed with open regions 19 so as when ultraviolet radiation is irradiated on it only waveguide sections which are to be passive are formed leaving a gap therebetween, where active segments can be formed. Curing radiation is applied through the mask as can be seen in FIG. 5. Uncured polymer is removed to leave the passive waveguide segments 20 formed on the cured lower cladding layer 14 as seen in FIG. 6.

Figure 7:
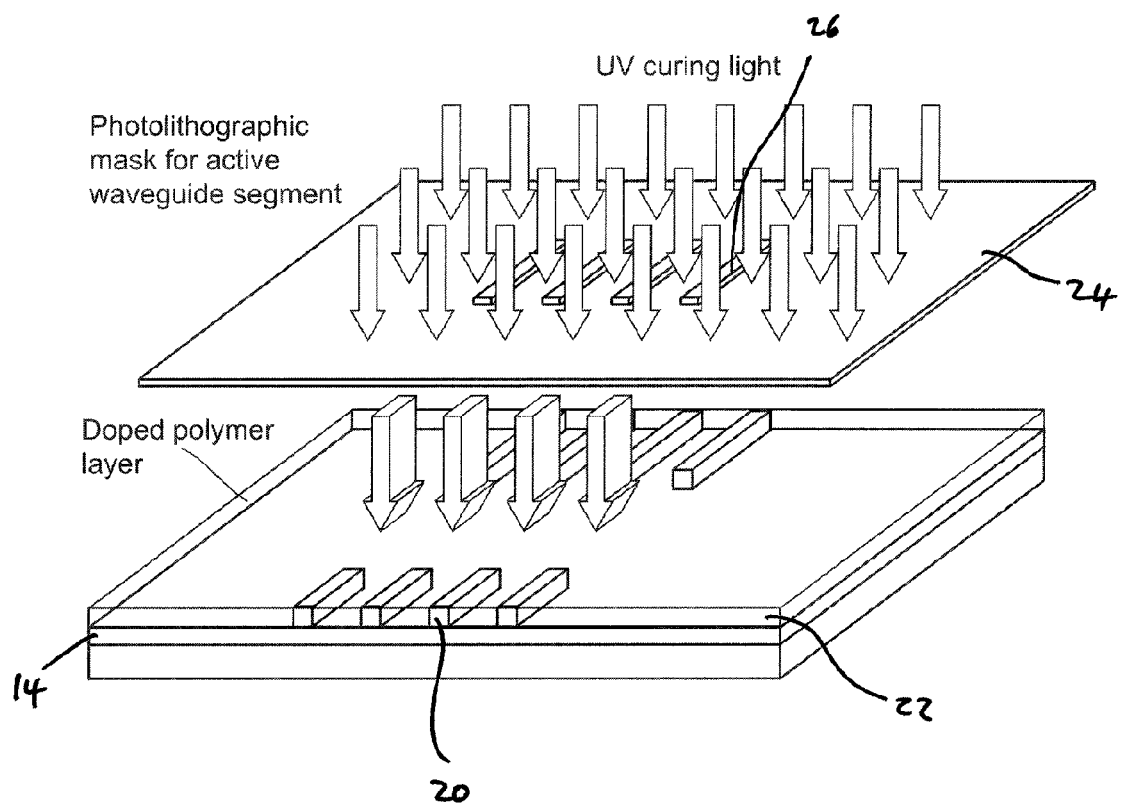

Next, as shown in FIG. 7, a layer 22 of uncured doped core polymer is provided on the remaining core structure preferably to the same thickness as the original undoped core layer. A mask 24 is provided having exposure regions 26 corresponding to the desired active regions of the waveguides within the amplification node. UV curing radiation is applied through the mask 24.

Figure 8:
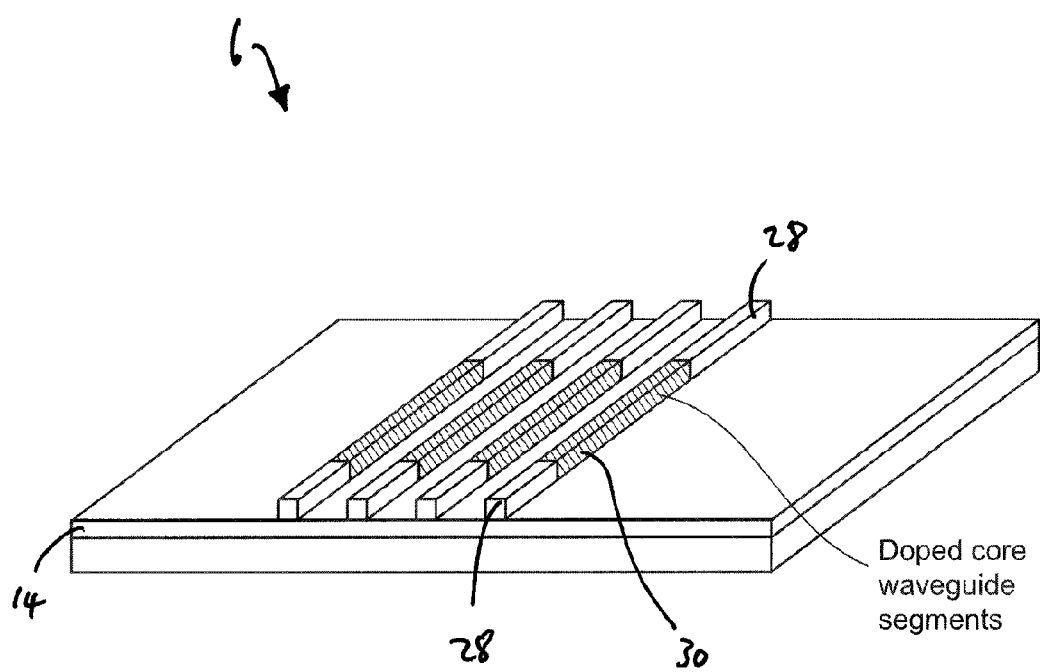

Finally, uncured doped polymer can be removed using the resultant structure as shown in FIG. 8. As can be seen, the remaining waveguide structures comprise un-doped input and output regions 28 together with a doped region 30 for each of the four waveguides within the amplification node 6. Thus, a simple and robust method of manufacture of an optical amplification node 6 on an optical PCB is provided. It will be appreciated that the formation of the amplification node can be provided as part of a larger process of manufacture of the entire PCB on which the amplification node is provided.

Cladding Lithography

Figure 9:
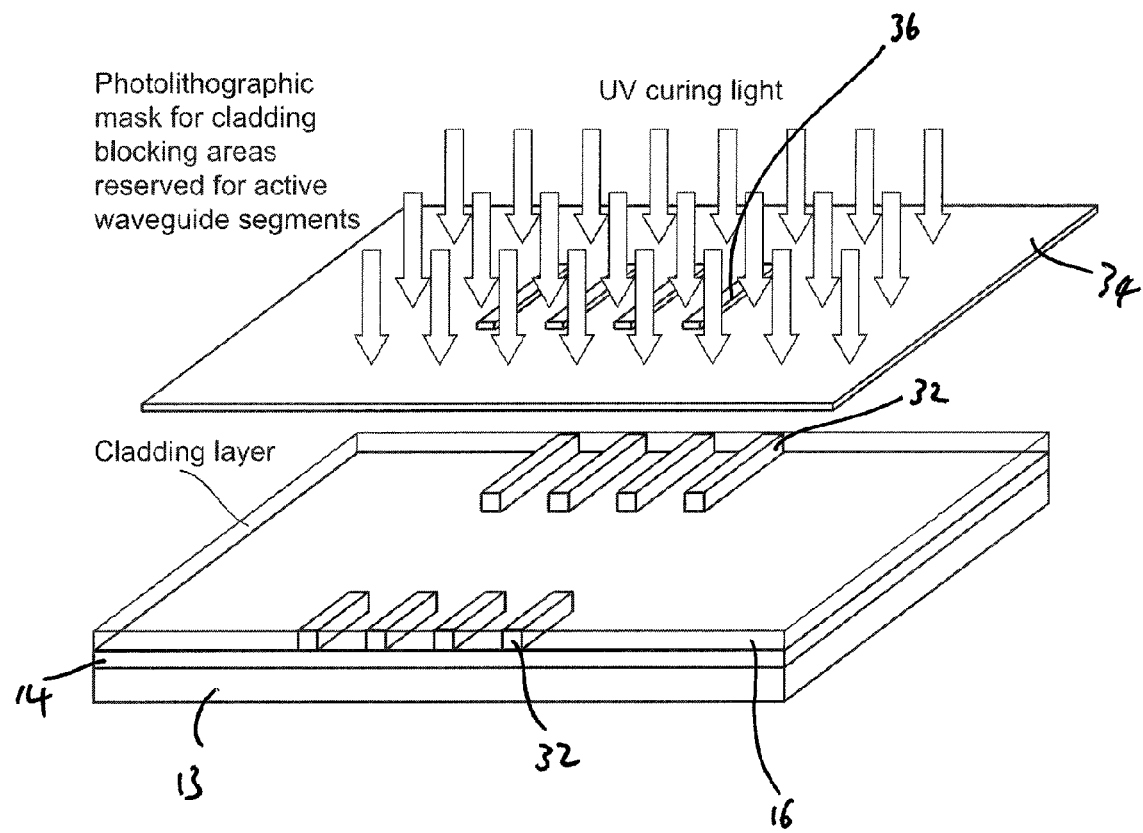
FIGS. 9 to 12 are schematic views showing the steps in another method of making a light amplification node.

FIGS. 9 to 12 show a schematic representation of the steps in another method of making a light amplification node on an optical PCB, the method being herein named as "cladding lithography". Referring to FIG. 9, a lower cladding 14 has been formed on the substrate 13. Waveguide cores 32 have also been formed on the lower cladding 14. The waveguide cores 32 are un-doped polymer cores. Next, an un-doped cladding layer 16 is provided over the entire structure. The cladding layer 16 is of the same thickness as the un-doped core layer. Next, a mask 34 is arranged in alignment with the structure. The mask 34 is a negative of the mask 24 shown in FIG. 7. In other words, the regions 36 of mask 34 are light blocking regions. All of the uncured cladding layer 16 is then irradiated through the mask 34.

Figure 10:
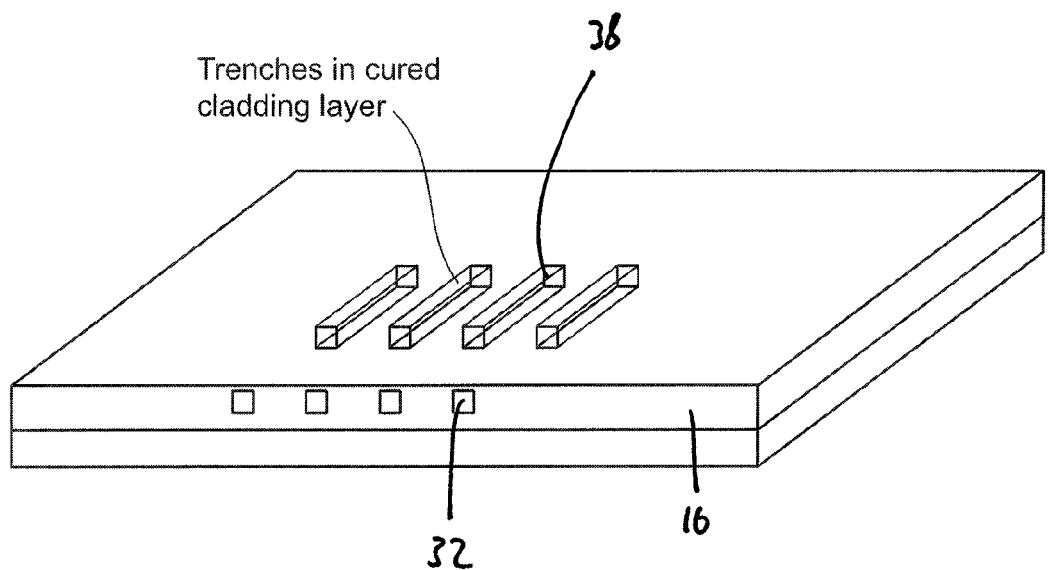
Figure 11:
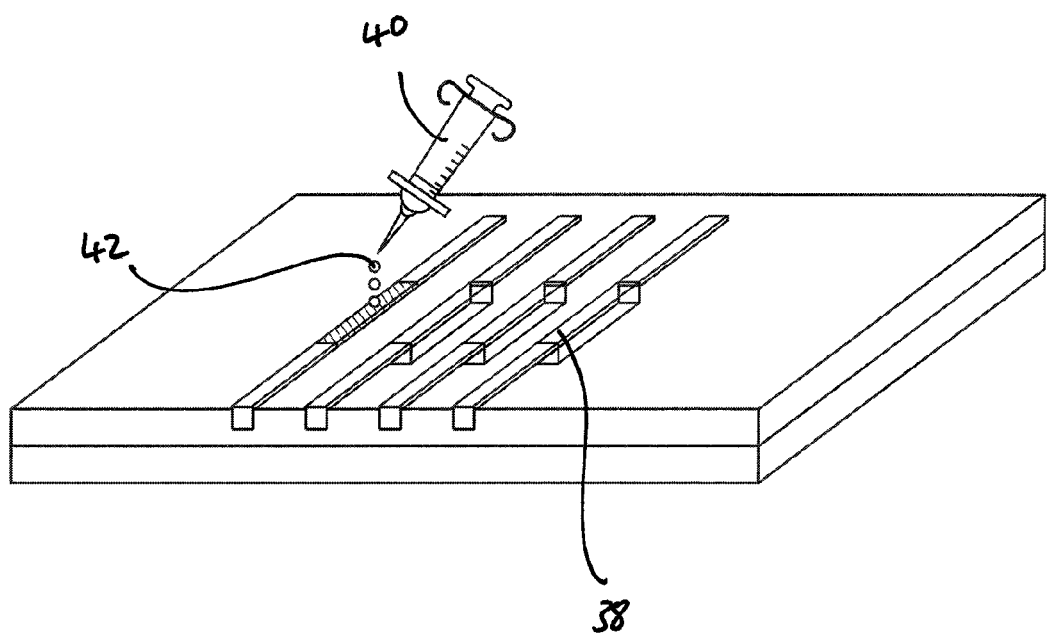
Figure 12:
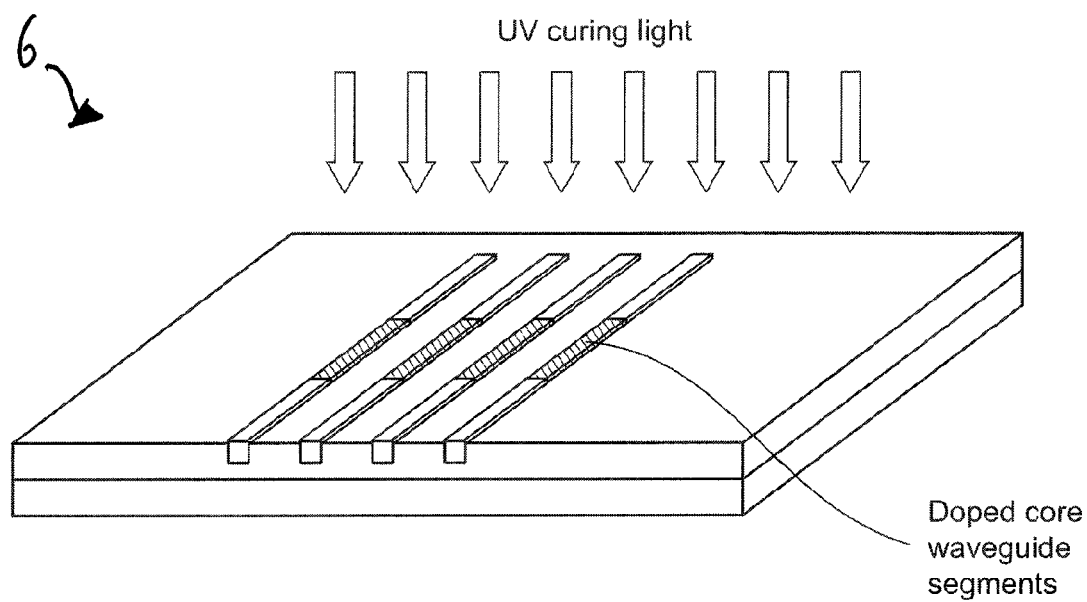

FIG. 10 shows the resulting structure. As can be seen, trenches 38 are formed corresponding to the light blocking regions 36 in the mask 34. The cladding layer 16 is now cured and the input to the waveguides 32 can be seen.

Next, a doped polymer is provided in the trenches. One preferred technique of applying the polymer is to fill each trench and apply a doctor blade to ensure a smooth and planar top surface which is, more of less, coplanar with the top surface of the un-doped waveguides. This can be seen in FIG. 11. Here, a filling device 40 is used to provide droplets of the doped polymer 42 into the trenches 38. Once the trenches 38 have been filled then a blanket cure may be applied to the resultant structure to produce the complete waveguides with passive and active regions as required. This method of manufacture has the advantage that the amount of doped polymer used is only that which is required to form the doped active regions of the amplification node 6 and there is little or no wastage as with the Double Core Lithography method.

Laser Ablation of Doped and Undoped Cores

Figure 13:
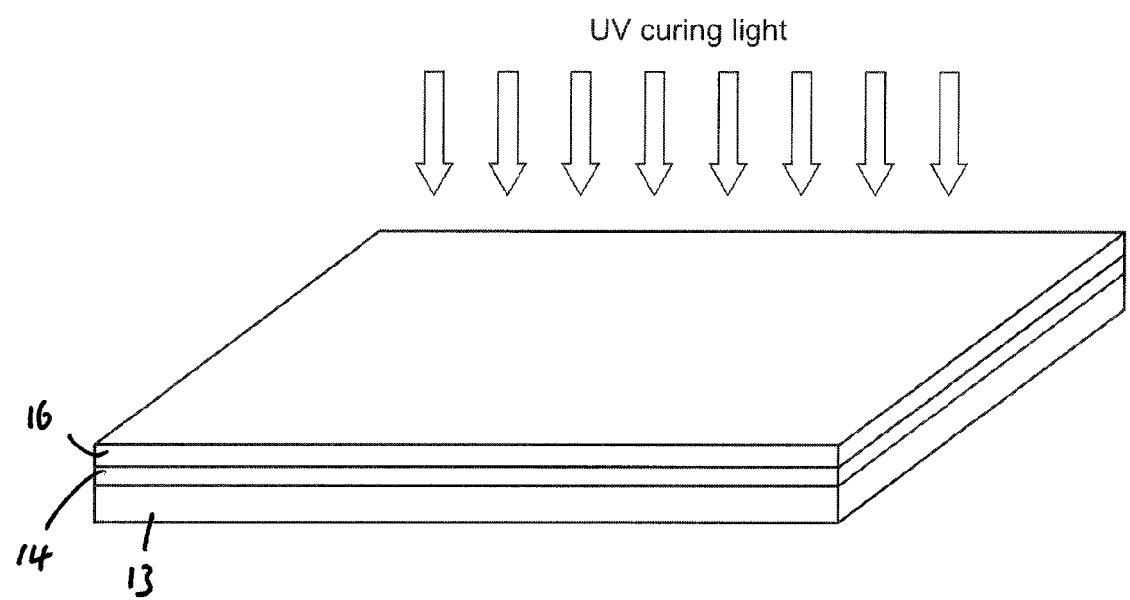
FIGS. 13 to 16 are schematic views showing the steps in another method of making a light amplification node.

FIGS. 13 to 16 are schematic views showing the steps in another method of making a light amplification node on an optical PCB, using laser ablation of doped and undoped cores. Referring to FIG. 13, as a first step, a lower cladding 14 is formed on a support layer 13. A polymer core layer 16 is provided over the entire lower cladding 14. A blanket cure is applied to the un-doped core polymer layer as shown in FIG. 13.

Figure 14:
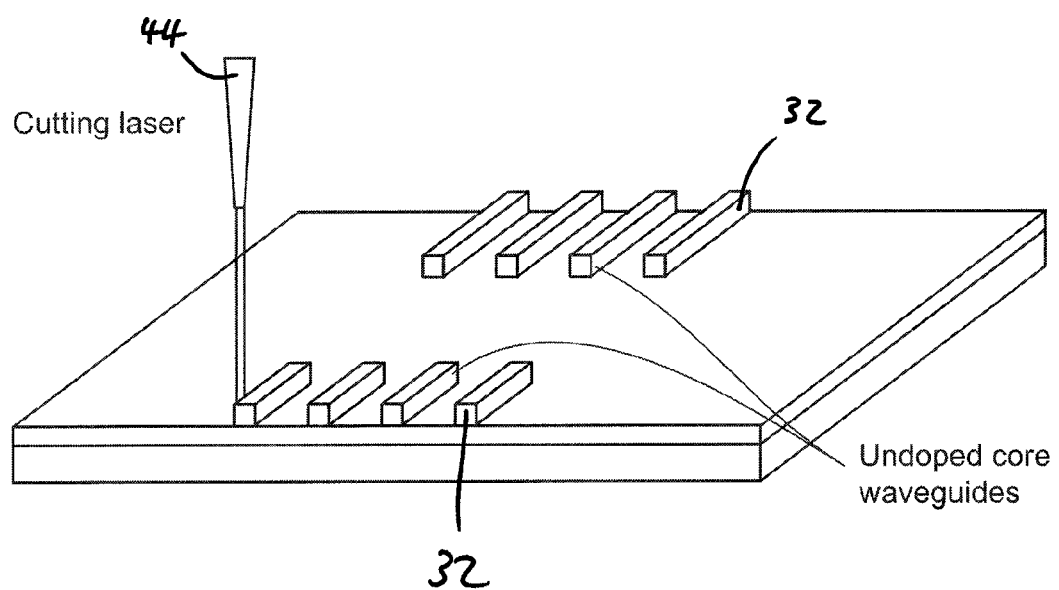
Figure 15:
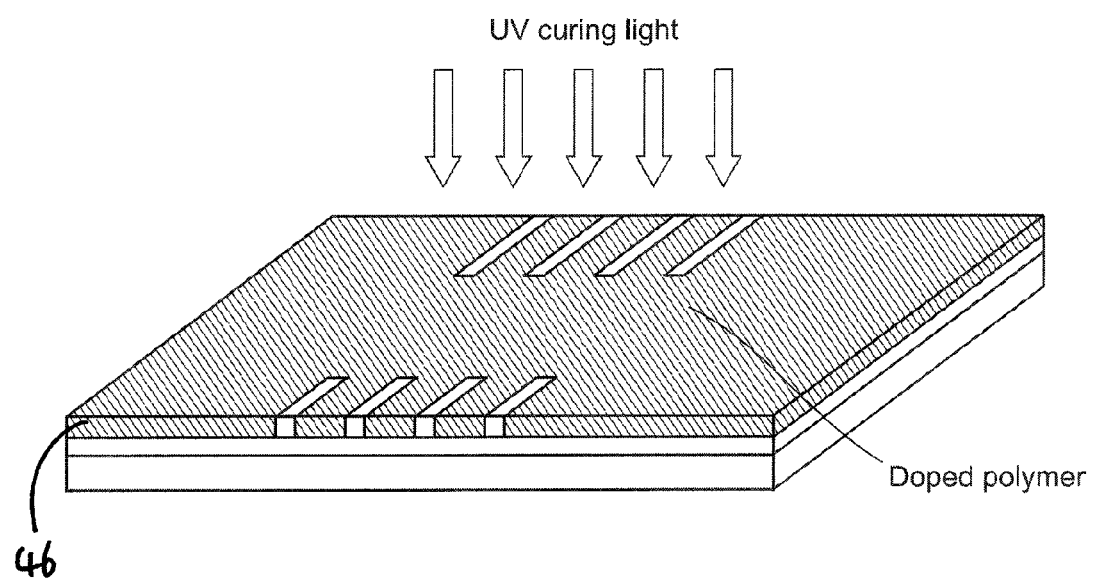
Figure 16:
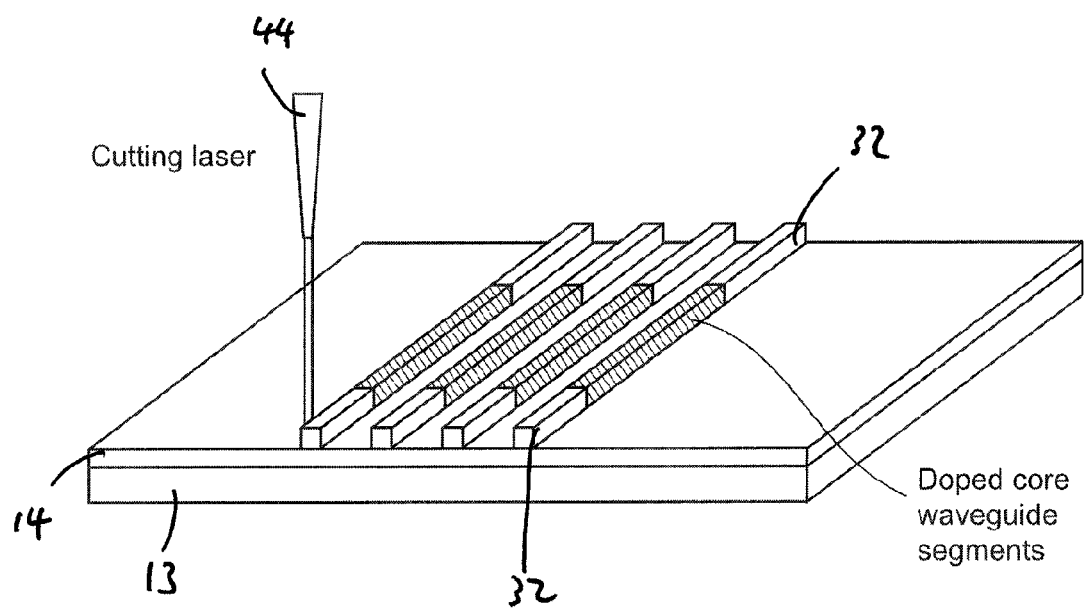
Figure 17:
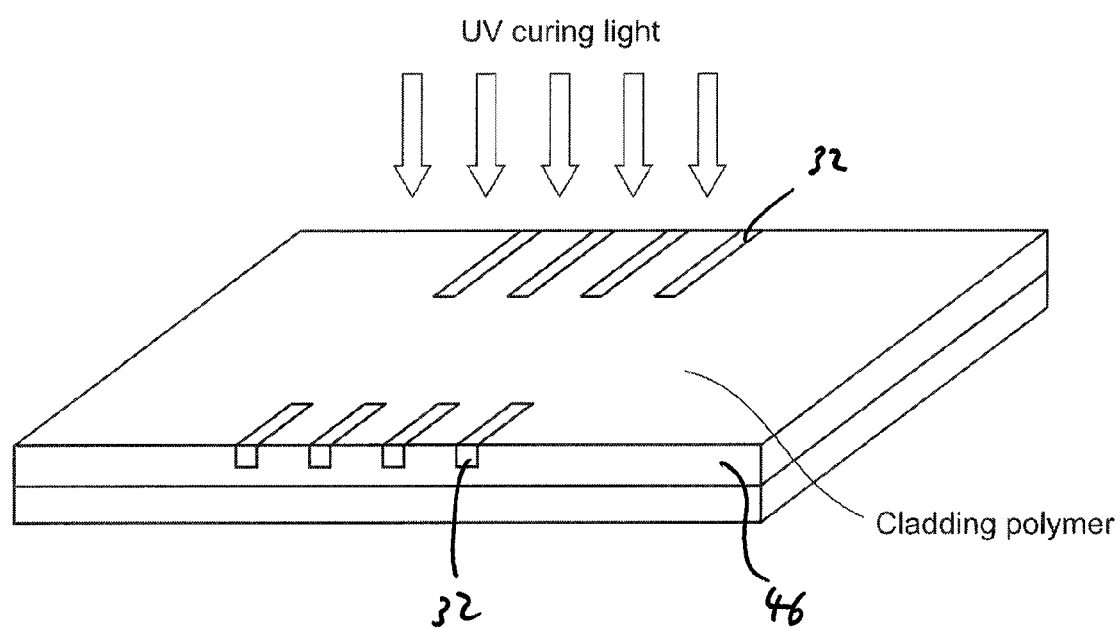
FIGS. 17 to 20 are schematic views showing the steps in another method of making a light amplification node.

Next, as shown in FIG. 14 laser ablation is used to etch the core layer to leave only passive (un-doped) waveguide segments 32. A cutting laser 44 is provided for this purpose. Any suitable cutting laser may be used. Examples include an Excimer laser. Next, as shown in FIG. 15, a uniform layer of doped core polymer 46 is provided on the resultant structure. Again, a blanket cure of UV curing radiation is provided. Next, the cutting laser is again used to remove the doped core in all sections apart from the desired regions between the un-doped waveguides 32.

Laser Ablation of Undoped Cores and Cladding

FIGS. 17 to 20 show a further method of making a light amplification node on a PCB, using laser ablation of undoped cores and cladding. The method of FIGS. 17 to 20 is a variation on that of FIGS. 13 to 16. In this example, once the un-doped waveguide regions 32 have been formed a layer of cladding polymer 46 is provided over the entire resultant structure.

Figure 18:
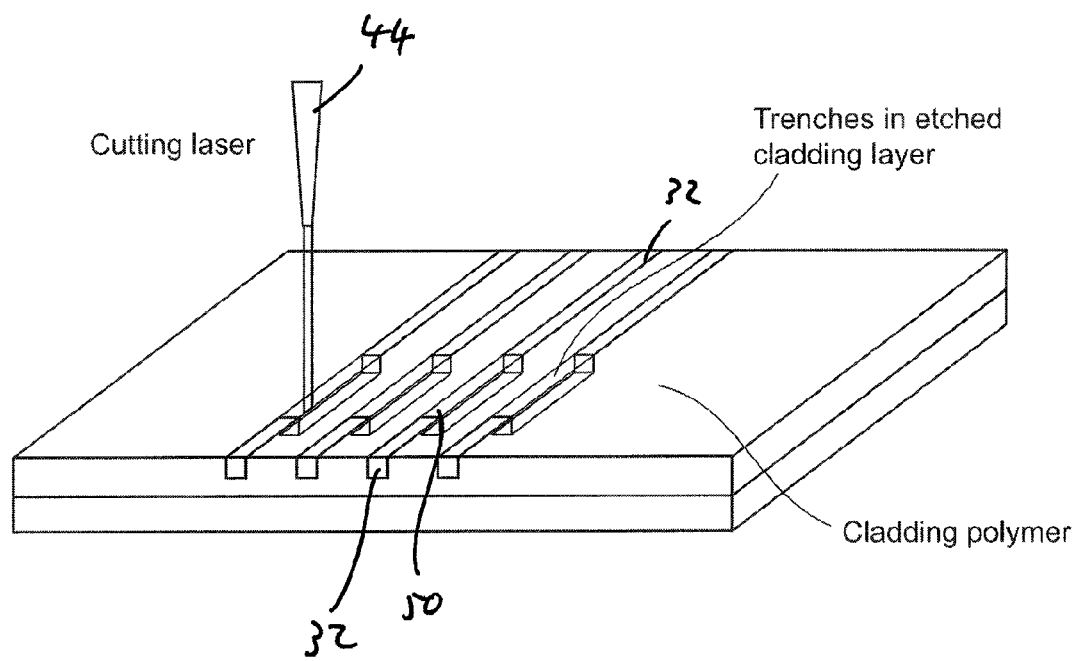

Next, a blanket cure is applied. Next, as shown in FIG. 18, the cutting laser 44 is used to ablate regions 50 between the un-doped waveguide cores 32. Thus, a trench is formed within the cured cladding polymer.

Figure 19:
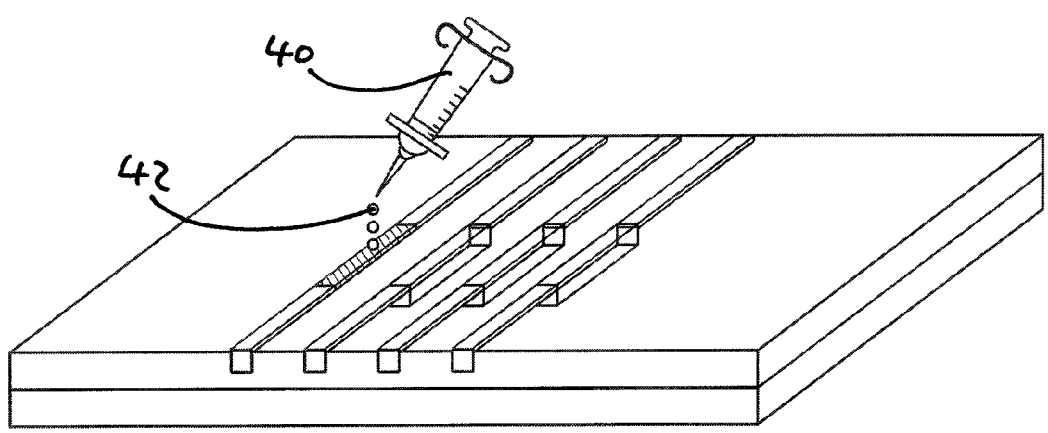
Figure 20:
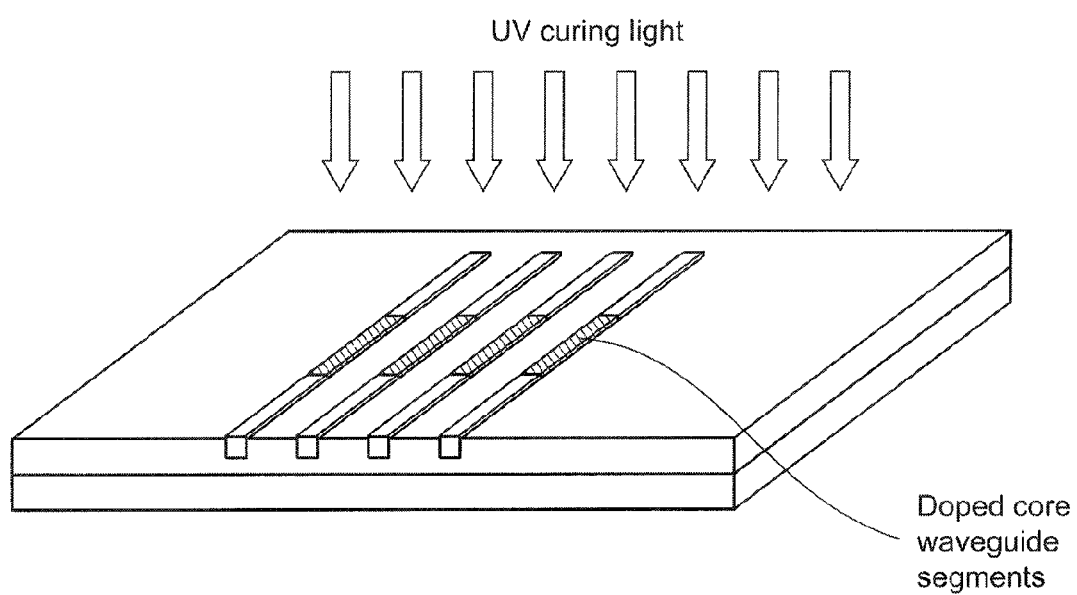

Next, as shown in FIG. 19, a device may be used to provide droplets of doped core waveguide material into the trenches. This is similar to the step shown in and described above with reference to FIG. 11. Once the doped polymer has been provided in the trenches a cure is provided as shown in FIG. 20.

Polymer Printing

Figure 21:
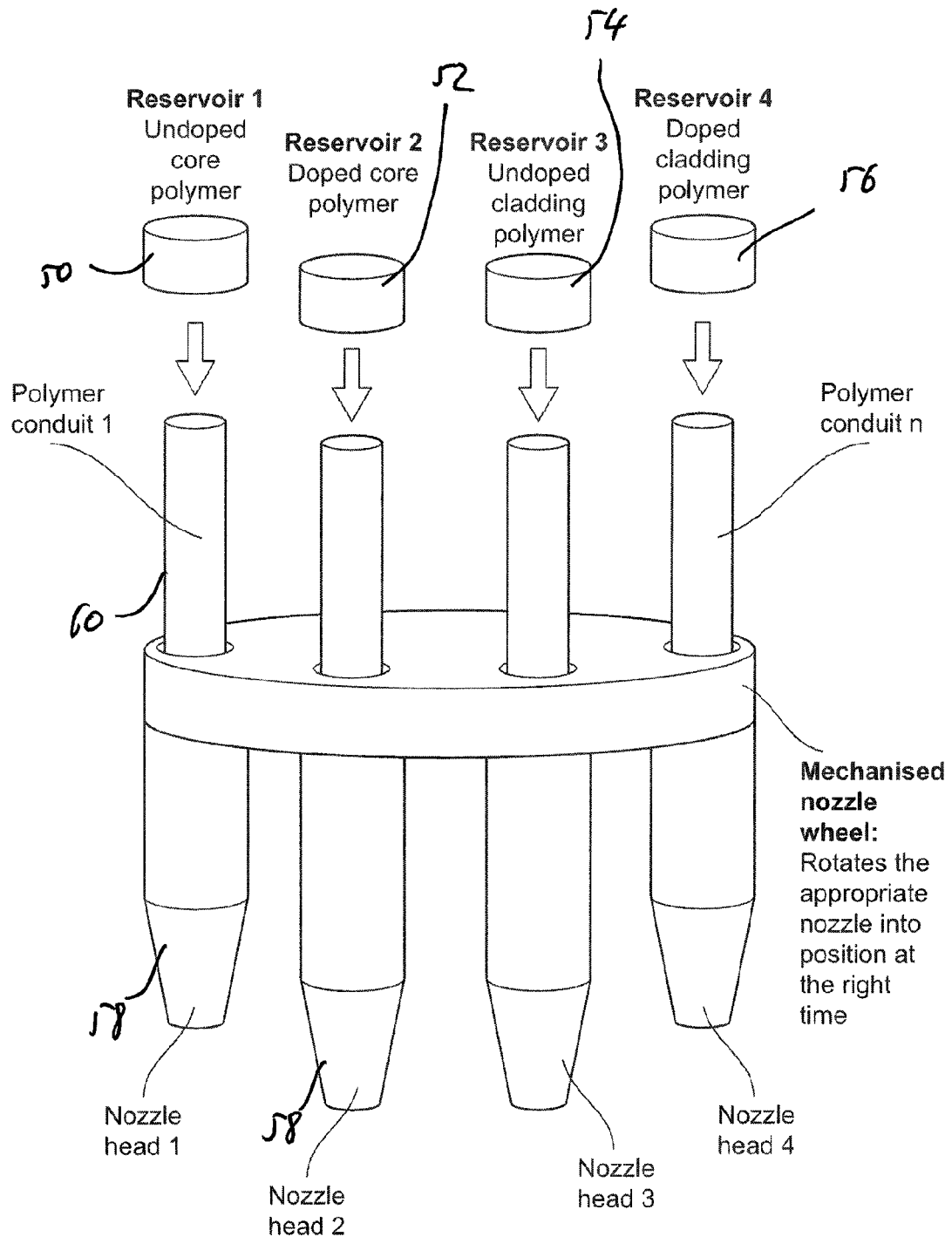
FIGS. 21 and 22 show schematic representations of apparatus for use in a method of forming a light amplification node.

FIG. 21 shows a schematic representation of apparatus for use in a method of forming a light amplification node on an optical PCB, using what is referred to herein as "polymer printing". In this example, waveguides may be written using a polymer jet printing process in which, in analogy to an inkjet printing process the polymer waveguide structures are deposited directly onto a substrate. In the preferred examples, core polymer is deposited directly onto the substrate to build up the waveguides. The method may be used to allow manufacture of passive and active segments of waveguides within a light amplification node. The process works by alternately drawing from multiple polymer reservoirs during the writing process.

Referring to FIG. 21, four reservoirs are shown. The first reservoir 50 contains un-doped core polymer. The second reservoir 52 contains doped core polymer. The third reservoir 54 contains un-doped cladding polymer and the fourth reservoir 56 contains doped cladding polymer. A nozzle assembly is provided including four nozzle heads 58. Each of the nozzle heads 58 is connected via an associated conduit 60 to its respective reservoir. As can be seen in FIG. 21, nozzle head 1 is connected via the conduit 60 to un-doped core polymer reservoir 50.

During manufacture, the appropriate nozzle is arranged over the substrate being written to and the waveguide is effectively printed in a manner analogous to inkjet printing, onto the substrate. Where a change of polymer material is required along the waveguide, e.g. moving from the un-doped core region to the doped core region, the nozzle operating is stopped from dispensing. The second required nozzle is moved into place and the second nozzle then recommences dispensing of the new material. It will be appreciated that the polymer printer can be used to dispense cladding as well as core polymer. This is why in the example of FIG. 21, four reservoirs and nozzles are shown. In an alternative, a selective polymer dispensing system with a single nozzle can be used, whereby the system can select from multiple polymer reservoirs in turn. This is shown in FIG. 22.

The advantage of a multiple nozzle system, such as that shown in FIG. 21 is that there is no cross-contamination between different polymer types. However care is needed so as to avoid misalignment issues during the nozzle change process. If writing a waveguide core with different material segments, care is needed to ensure that segments are not displaced with respect to one another. This can be achieved using standard control techniques.

Using the single nozzle system, there are no misalignment issues between material changes as the nozzle position does not change. In other words the single nozzle is moved along the trajectory of the waveguide and it is the material source that is changed. Care is needed in this example to ensure that there is no cross-contamination between different polymer types.

Figure 22:
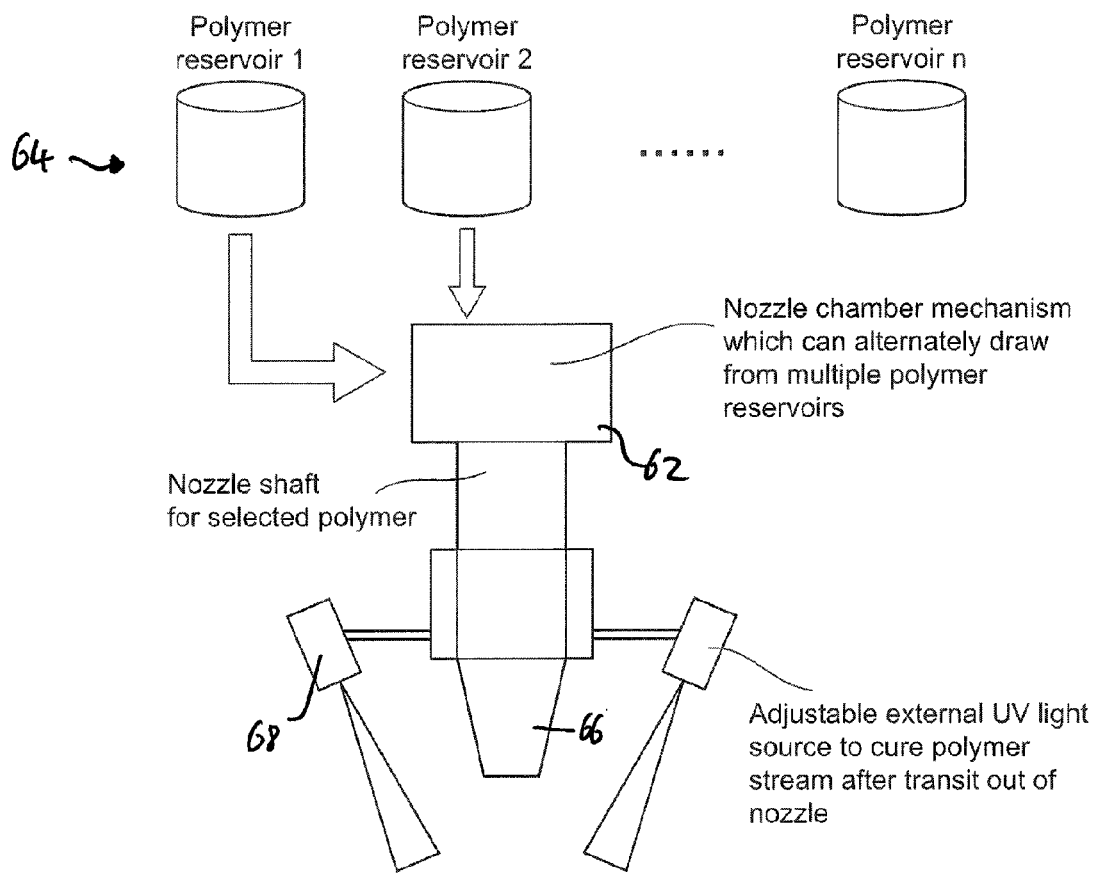

Referring to FIG. 22, a mixing reservoir 62 is provided which is arranged to draw the required polymer from one of the polymer reservoirs 1 to n 64. The assembly of FIG. 22 comprises a single nozzle outlet 66 and preferably an adjustable external UV light sources 68 to cure the polymer stream after transit out of the nozzle 66. In one embodiment, an additional reservoir in either the system of FIG. 21 or FIG. 22 is provided which contains solvent, to allow the nozzle to automatically clean itself. This is a preferred embodiment and is not shown in either of the figures.

Figure 23:
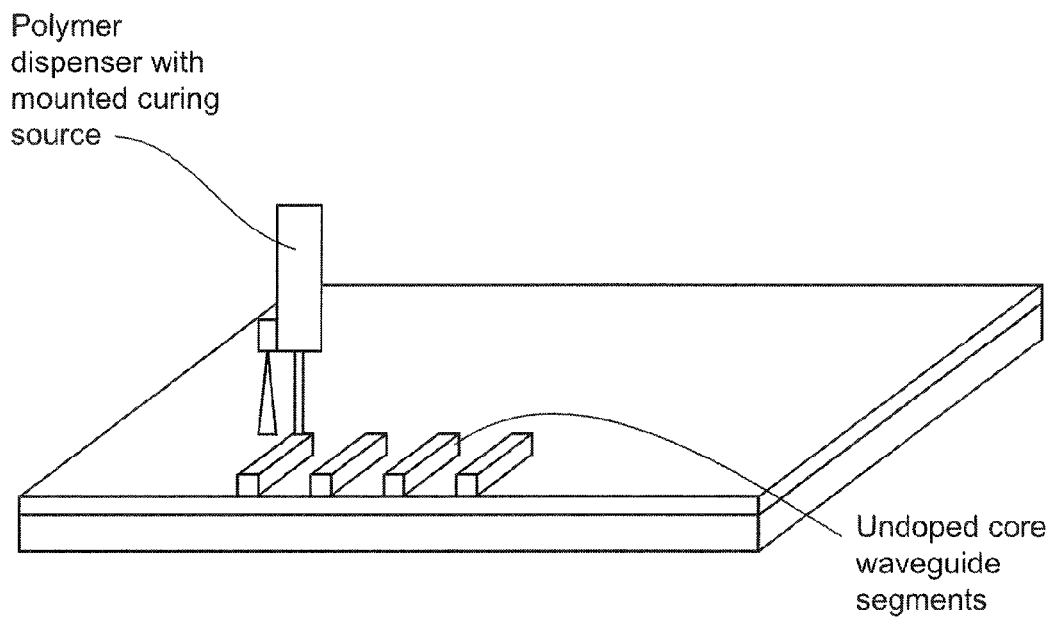
FIGS. 23 to 25 are schematic views showing the steps in another method of making a light amplification node.
Figure 24:
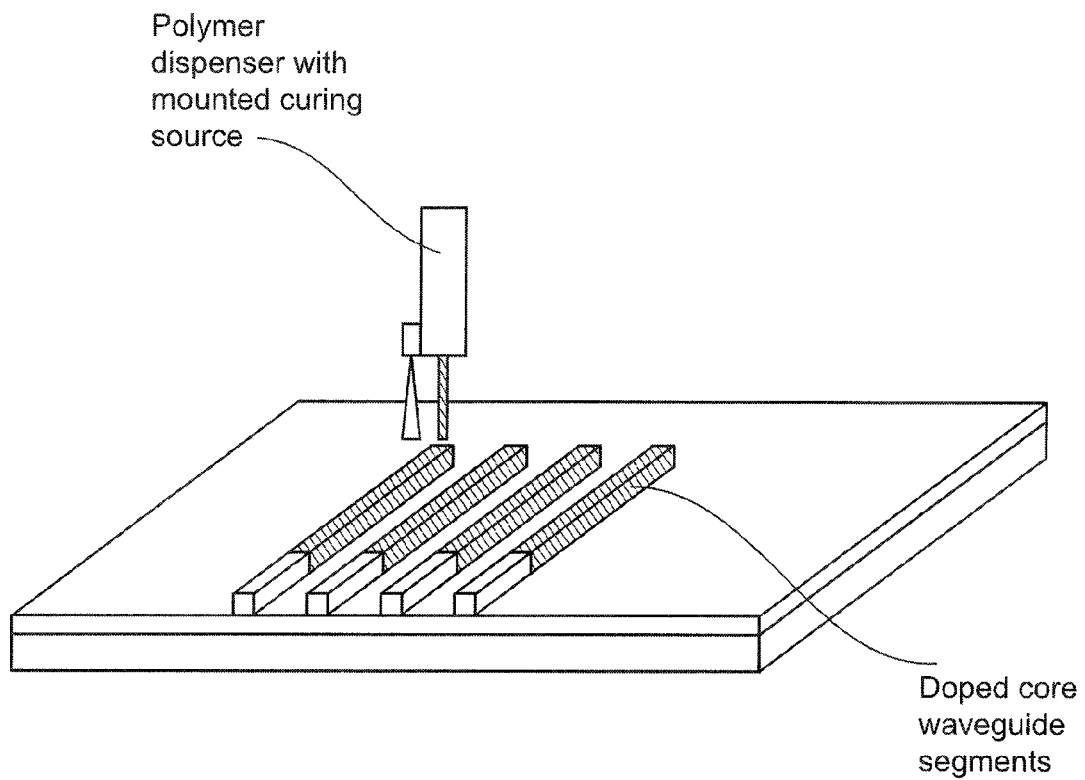
Figure 25:
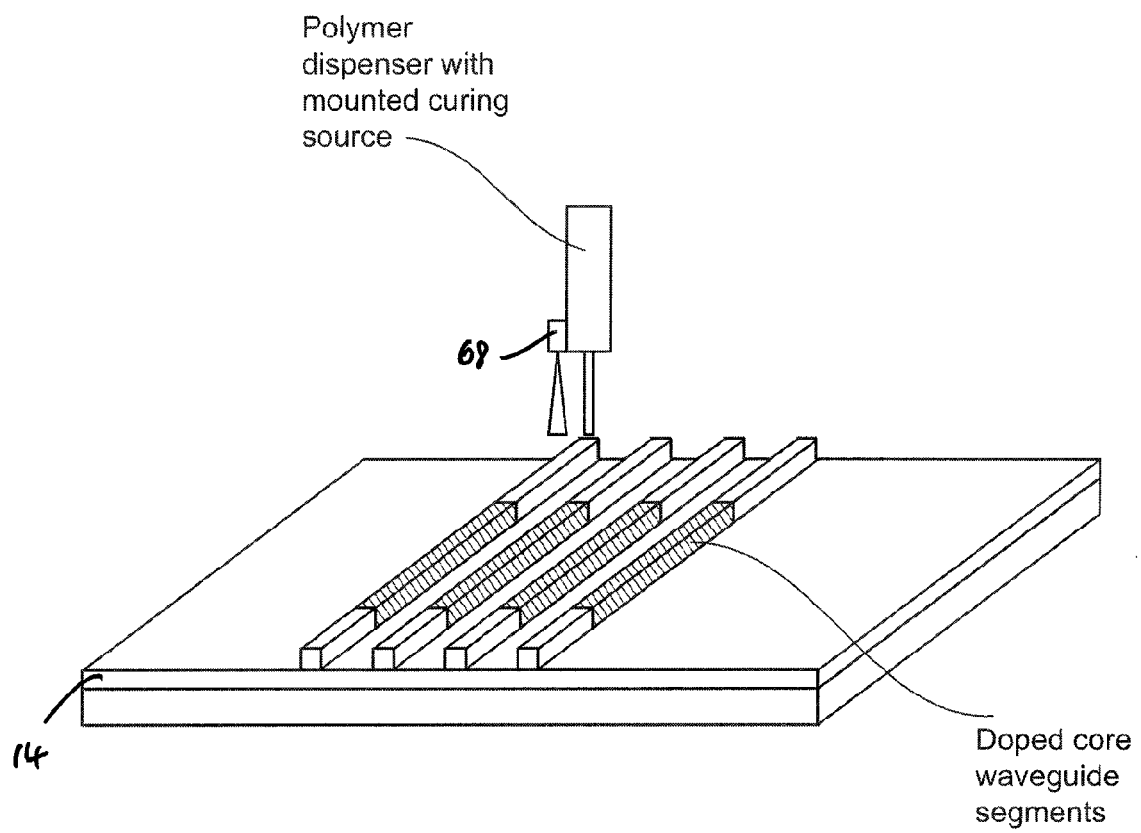

In use, the assembly of FIG. 22 will operate as follows. First, the polymer printing nozzle 66 dispenses un-doped core polymer to create a first passive core segment of waveguide. This can be seen in FIG. 23. Next, as shown in FIG. 24, the polymer printing nozzle switches to the doped core polymer reservoir and continues writing the active core segment of the light amplification node 6. Upon completion of writing the active core segment, the polymer printing nozzle switches back to the un-doped core polymer reservoir and continues writing the passive waveguide. This is shown in FIG. 25. During dispensation, at all stages, the UV source 68 is arranged to cure the polymer as it makes contact with the lower cladding 14.

Figure 26:
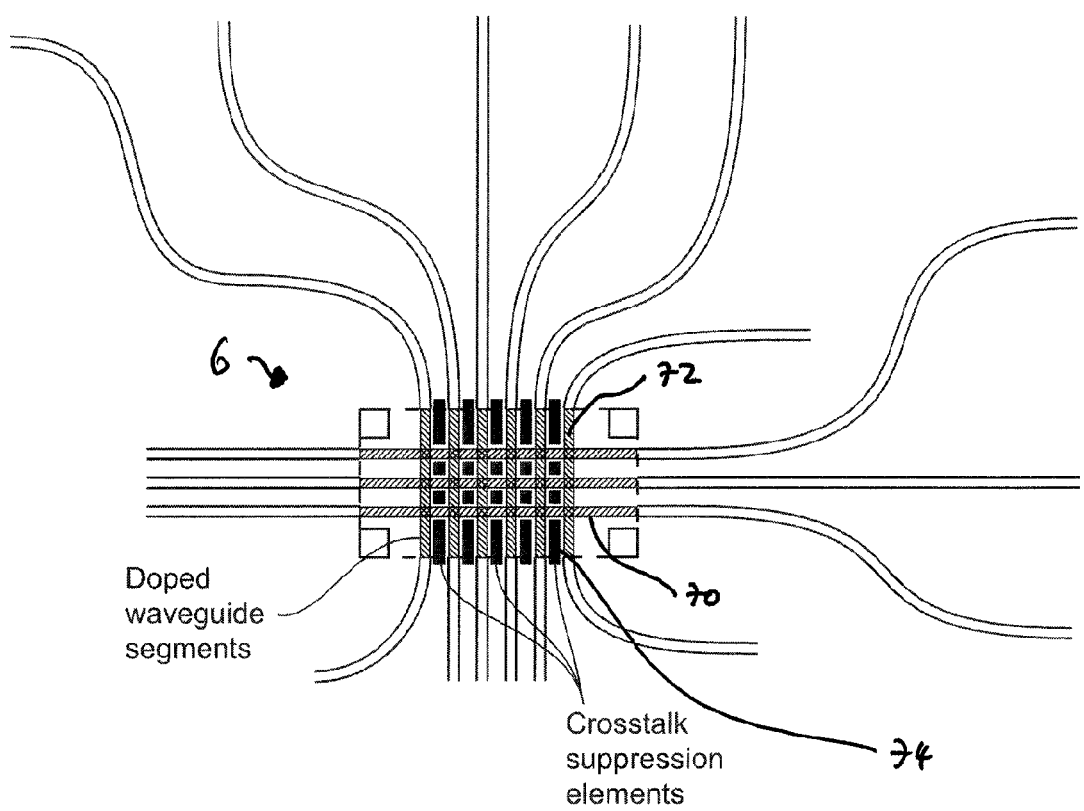
FIGS. 26 and 27 are schematic representations of a light amplification node with crossovers.
Figure 27:
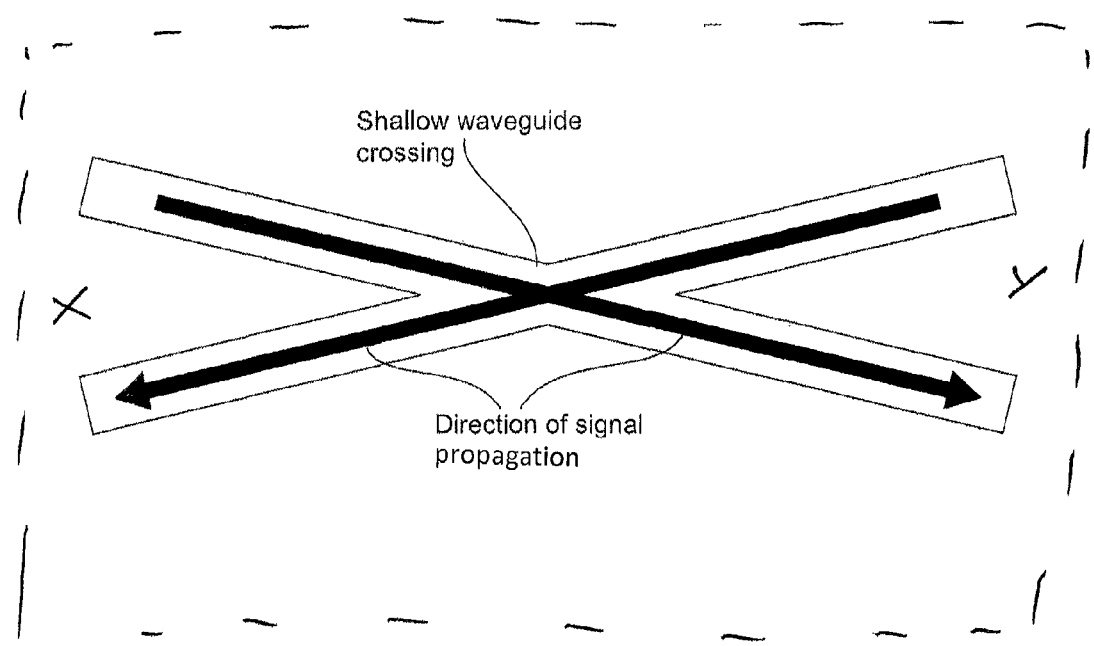

FIGS. 26 and 27 show further examples of a light amplification node. In these examples, crossovers are provided. In order to further reduce the complexity of re-routing waveguides to an amplification node, waveguides can be crossed over in the amplification node as shown in FIG. 26. This means that, for instance, a given waveguide will not need to be re-routed to align with a single axis as shown in FIG. 2. Instead, there are two possible input configurations (or output configurations) for each amplification node. This means that less additional bends are required in the waveguides to arrive at the amplification node in a suitable contact direction.

Referring to FIG. 26, the amplification node 6 includes doped waveguides 70 which cross the amplification node 6 in a horizontal direction. In addition, the amplification node 6 includes doped waveguides 72 which cross the amplification node in a vertical direction. Thus, a crossover network of doped waveguide regions is formed within the amplification node. This has the benefits discussed above of providing an additional configuration for inputs and outputs to reach the amplification node and therefore enables a reduced amount of re-routing of waveguides to be achieved.

As in the examples described above, crosstalk suppression elements are desired. In this example, since the doped waveguide regions form a network of crossover points, the crosstalk suppression elements 74 are shaped accordingly to ensure that crosstalk between any two waveguides is avoided or minimised.

In the example of FIG. 26, the angle of crossover between the two sets of waveguides 72 and 74 is 90 degrees, in other words, they are orthogonal. This is not necessary. FIG. 27 shows a schematic representation of a crossover in which the angle of crossover is not 90 degrees. This might be useful where there is a concentration of optical components at opposite longitudinal ends of a PCB and a single optical amplification node is desired. For example, with reference to FIG. 27 it might be that there is a concentration of optical components at one end X of the PCB and a concentration at the opposite end Y. Having a non-orthogonal crossover angle within the amplification node is particularly useful in this example.

It will be appreciated that given that waveguides can cross each other over a range of angles, not just orthogonally, there can be multiple (more than two) ingress and egress angles of waveguides entering any node. Crosstalk suppression features or elements would thus be shaped accordingly. This is particularly useful if there is a need to fit even more waveguides into a given amplification node.

Thus far, the description has been with respect to the waveguides within the amplification node on the PCB. It will be appreciated that in addition to the doped waveguides, a pump source may be provided to enable the amplification node to function in use. The pump source may be provided as an integral part of the amplification node and optical PCB or separately for arrangement with the amplification node and optical PCB. In its most basic sense, the amplification node may be thought of as the confluence of doped waveguides within a specific region of the optical PCB.

This pump source can be of any suitable form and includes UV lamps, LEDs, or lasers. In any areas of the PCB exposed to pump radiation, copper layers should preferably not be directly exposed to this radiation. Such exposure may, if the radiation exceeds the threshold frequency of the copper, give rise to the Photoelectric Effect whereby electrons in the conduction band of the copper absorb the pump radiation and are ejected from the layer. This can have detrimental effects on the PCB as a whole, degrading the polymer and substrate material layers bounding the copper layer through constant electron bombardment. In addition it is possible that electron emission can cause interference effects, giving rise to electronic crosstalk or current leakage effects changing the effective impedance between the electronic components, structures or layers in the electronic PCB.

Figure 28:
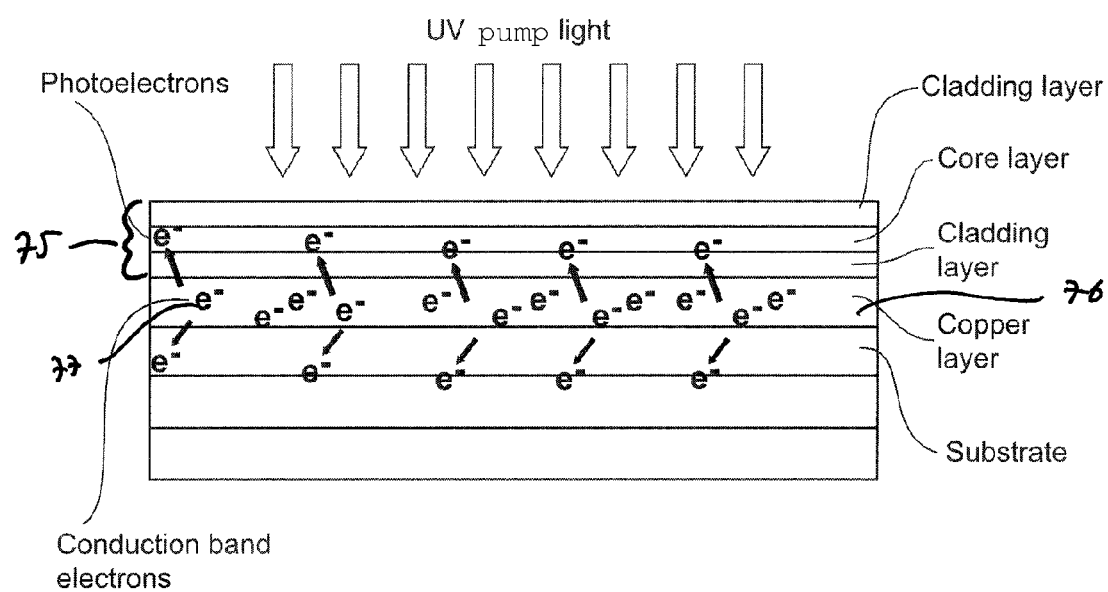
FIG. 28 shows a schematic representation of an optical PCB during manufacture without shielding.

This is shown schematically in FIG. 28. As can be seen, the optical PCB is irradiated by a uniform UV pump light. The UV pump light performs the required function by pumping the doped waveguide regions within the optical layers 75 on the optical PCB. However, not all the energy of the pump light is absorbed by the optical layers 75 and so the copper layer 76 within the PCB receives the extraneous UV pump light that has passed through the optical layers 75. Electrons 77 within the copper layer are excited by the pump light and are ejected from the copper layer.

Figure 29:
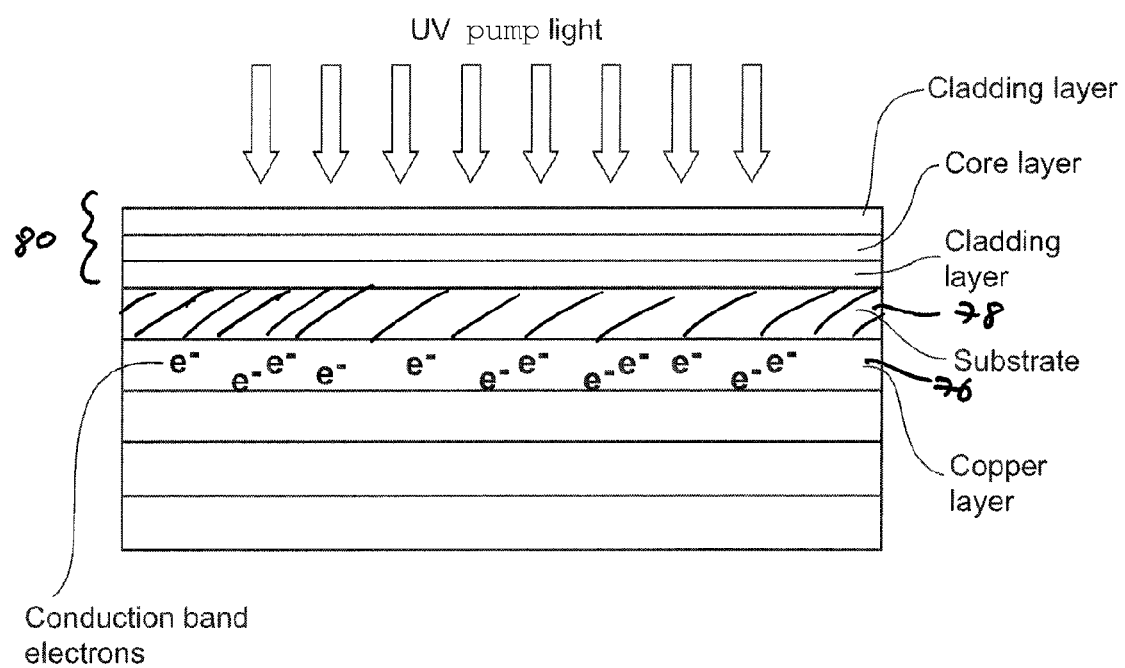
FIG. 29 shows a schematic representation of an optical PCB during manufacture with shielding.

To address this, in one embodiment, an arrangement such as that shown in FIG. 29 is provided. In this case, a PCB substrate layer 78 is provided between the copper layer 76 and the optical layers 80 of the electro-optical PCB. Thus, the photoelectric effects are mitigated by ensuring an adequate radiation shielding layer between the active polymer regions and the next copper layer (or any metallic electronically conductive layer). In the example of FIG. 29, a substrate such as an FR4 layer is arranged between the active polymer region and the next copper layer 76. This is how the optical PCB is preferably stacked. In some cases an additional FR4 or other support layer is provided within the PCB structure. Generally it is preferred that where an optical PCB is provided with an amplification node, the optical layers of the PCB are provided on one side of a or the PCB support layer and the electrical layers are provided on the other opposite side of the PCB support layer. That way the PCB support layer acts to shield the electrical layers from interference effects due to the irradiation of the waveguide sections in the amplification node.

Figure 30:
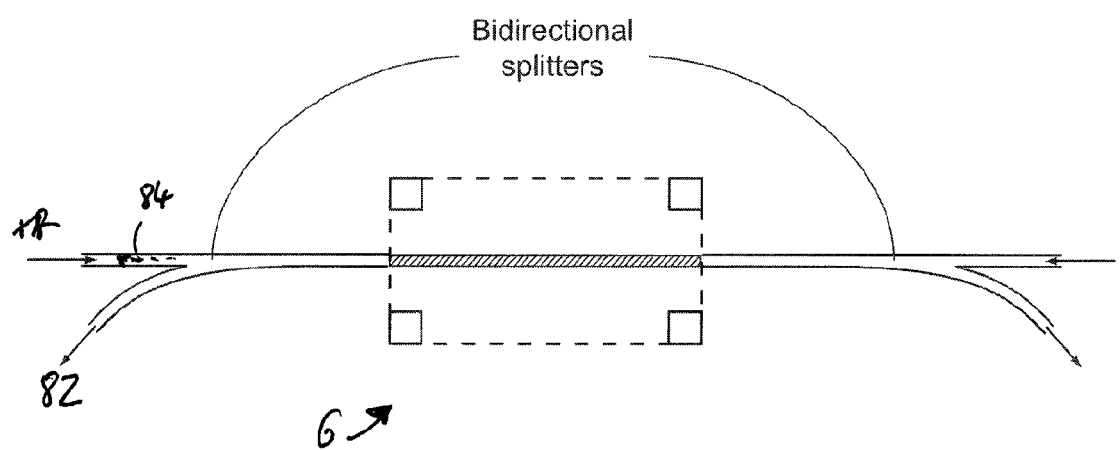
FIG. 30 is a schematic representation of a light amplification node.

FIG. 30 shows a schematic representation of an amplification node 6 on an optical PCB. In fact only a single physical waveguide is shown in the node. However, the waveguide is used to convey two different signals propagating in opposite directions and hence may be thought of logically as two waveguides.

The post-amplification signal (in either direction) is split out after the amplification node. This is not a particularly clean or energy efficient arrangement in that only around half of the post-amplified signal light is conveyed along the desired branch 82. The other half is conveyed "against the traffic" along the other branch 84. This can be detrimental to optical signal integrity as some light would be conveyed into the optical cavity of a laser transmitting device (typically a diode laser) which can cause severe optical jitter due to undesired lasing. Back-reflection or optical return loss in a standard fibre optic system would have the same effect and usually steps are taken to mitigate this. Thus, although not preferred, the arrangement of FIG. 30 provides a means by which the waveguide density within the amplification node 6 can be increased further. In other words a single physical waveguide performs the function of two logical waveguides.

Embodiments of the present invention have been described with particular reference to the examples illustrated. However, it will be appreciated that variations and modifications may be made to the examples described within the scope of the present invention.

The invention claimed is:

1. An optical printed circuit board, comprising:
   plural polymer waveguides having undoped sections and doped sections, each of the doped sections being doped with an amplifying dopant;
   an optical pump source to pump the plural doped polymer waveguide sections, wherein the plural waveguide sections are routed so as to pass through an amplification zone in which the plural doped polymer waveguide sections are arranged close or adjacent to one another such that the optical pump source is able to pump plural of the doped optical waveguide sections and wherein the undoped sections are not within the amplification zone.

2. An optical printed circuit board comprising:
   plural polymer waveguide sections from independent waveguides, each of the sections being doped with an amplifying dopant;
   an optical pump source to pump the plural polymer waveguide sections, wherein the plural waveguide sections are routed so as to pass through an amplification zone in which the plural polymer waveguide sections are arranged close or adjacent to one another such that the optical pump source is able to pump plural of the optical waveguide sections; and,
   crosstalk suppression elements to reduce crosstalk between the plural polymer waveguide sections.

3. An optical printed circuit board according to claim 2, wherein a crosstalk suppression element is provided between each pair of polymer waveguide sections.

4. An optical printed circuit board according to claim 2, in which the or each crosstalk suppression element comprises a trench formed between the respective pair of polymer waveguide sections.

5. An optical printed circuit board according to claim 4, in which the trench is an air-filled trench.

6. An optical printed circuit board according to claim 4, in which the trench is filled with an optical blocking material.

7. An optical printed circuit board according to claim 6, in which the optical blocking material comprises a transparent matrix having suspended therein an optically absorbent material.

8. An optical printed circuit board according to claim 1, in which the plural polymer waveguide sections are arranged so that they do not cross within the amplification zone.

9. An optical printed circuit board according to claim 1, in which the plural polymer waveguide sections are arranged to cross each other within the amplification zone.

10. An optical printed circuit board according to claim 1, in which at least one pair of polymer waveguide sections are arranged so that they do not cross within the amplification zone and at least one pair of polymer waveguide sections are arranged so that they do cross each other within the amplification zone.

11. An optical printed circuit board according to claim 1, in which the dopant is selected from the group consisting of lanthanide ions, Terbium ($Tb^{3+}$), Dysprosium ($Dy^{3+}$), Europium ($Eu^{3+}$), Samarium ($Sm^{3+}$) and complexes thereof or fluorescent dyes.

12. A method of making an optical amplification node, the method comprising:
   providing a PCB substrate;
   on the substrate forming plural waveguides;
   routing at least two of the waveguides so that they pass in close proximity to each other;
   forming between the at least two waveguides one or more crosstalk suppression elements;
   doping the at least two waveguides in the region in which they pass in close proximity to each other so as to form plural doped polymer waveguide sections and to enable the waveguides to amplify optical signals passing therethrough in the presence of pump radiation.

13. A method according to claim 12, comprising providing an optical pump source to pump the plural doped polymer waveguide sections.

14. A method according to claim 12, in which the step of forming the waveguides comprises:
   forming an undoped polymer core layer on a substrate and patterning the undoped polymer core layer to form undoped sections of the waveguides;
   forming a doped polymer core layer on the substrate and patterning the doped polymer core layer to form the doped sections and to connect with the undoped sections.

15. A method according to claim 12, in which the step of forming the waveguides comprises:
   forming undoped sections of the waveguides
   forming an undoped lower cladding layer on a substrate, surrounding entirely the formed undoped sections of the waveguides;
   patterning the undoped lower cladding layer to leave trenches corresponding to regions for the formation of plural doped polymer waveguide sections;
   forming plural doped polymer waveguide sections within the trenches.

16. A method according to claim 12, in which the step of forming the waveguides comprises:
   forming an undoped polymer layer on a substrate;
   ablating the undoped polymer material from all regions apart from those required for the formation of undoped sections of the waveguides;
   forming a layer of doped polymer material on the resultant structure;
   ablating the doped polymer material from all regions apart from those required for the formation of doped and/or undoped sections of the waveguides.

17. A method according to claim 12, in which the step of forming the waveguides comprises:
   forming an undoped polymer layer on a substrate;
   ablating the undoped polymer material from all regions apart from those required for the formation of undoped sections of the waveguides;
   applying a cladding layer over the resultant structure;
   ablating the cladding layer from regions required for the formation of the doped sections of the waveguides;
   forming plural doped polymer waveguide sections within the ablated regions of the cladding layer.

18. A method according to claim 12, in which the step of forming the waveguides comprises inkjet printing one or more polymer materials of a required composition to form waveguides on a substrate, the method comprising;
    printing a first region of undoped core polymer material to form undoped sections of the waveguides;
    printing a second region of doped core polymer material to form doped sections of the waveguides.

19. A method according to claim 18, comprising, applying curing radiation to the waveguide sections substantially simultaneously with the printing.

20. A method according to claim 12, in which the waveguides are formed on a first major surface of the PCB substrate, the method comprising:
    forming on a second opposite major surface of the PCB substrate one or more electrical layers and conductors.

\* \* \* \* \*